(12) United States Patent
Dary et al.

(10) Patent No.: US 9,412,568 B2
(45) Date of Patent: Aug. 9, 2016

(54) LARGE-AREA SPUTTERING TARGETS

(71) Applicant: H.C. Starck, Inc., Newton, MA (US)

(72) Inventors: Francois-Charles Dary, Boston, MA (US); Mark Gaydos, Nashua, NH (US); William Loewenthal, Chesterland, OH (US); Steven A. Miller, Canton, MA (US); Gary Rozak, Akron, OH (US); Scott Jeffrey Volchko, Cleveland, OH (US); Stefan Zimmermann, Bad Saeckingen (DE); Michael Thomas Stawovy, Cleveland Heights, OH (US)

(73) Assignee: H.C. Starck, Inc., Newton, MA (US)

( * ) Notice: Subject to any disclaimer, the term of this patent is extended or adjusted under 35 U.S.C. 154(b) by 624 days.

(21) Appl. No.: 13/628,093

(22) Filed: Sep. 27, 2012

(65) Prior Publication Data
US 2013/0081944 A1 Apr. 4, 2013

Related U.S. Application Data

(60) Provisional application No. 61/540,644, filed on Sep. 29, 2011, provisional application No. 61/648,333, filed on May 17, 2012.

(51) Int. Cl.
*C23C 14/34* (2006.01)
*H01J 37/34* (2006.01)
*B05D 1/02* (2006.01)
*B23K 31/02* (2006.01)
*C23C 24/04* (2006.01)

(52) U.S. Cl.
CPC ............. *H01J 37/3429* (2013.01); *B05D 1/02* (2013.01); *B23K 31/02* (2013.01); *C23C 14/3407* (2013.01); *C23C 14/3414* (2013.01); *C23C 24/04* (2013.01); *H01J 37/3426* (2013.01); *Y10T 156/10* (2015.01)

(58) Field of Classification Search
CPC .... C23C 14/3407; C23C 14/3414; C23C 24/04; H01J 37/3414; B05D 1/02; Y10T 156/10; B23K 21/02
USPC ........................................ 204/298.12, 298.13
See application file for complete search history.

(56) References Cited

U.S. PATENT DOCUMENTS

| 3,436,299 A | 4/1969 | Halek |
| 3,990,784 A | 11/1976 | Gelber |
| 4,011,981 A | 3/1977 | Danna et al. |
| 4,050,133 A | 9/1977 | Cretella et al. |
| 4,059,442 A | 11/1977 | Bernard |

(Continued)

FOREIGN PATENT DOCUMENTS

| CA | 2482287 A1 | 10/2002 |
| CN | 100364618 C | 1/2008 |

(Continued)

OTHER PUBLICATIONS

Translation to Yamagishi (JP 63-227774) published Sep. 1988.*

(Continued)

*Primary Examiner* — John Brayton
(74) *Attorney, Agent, or Firm* — Morgan, Lewis & Bockius LLP

(57) ABSTRACT

In various embodiments, joined sputtering targets are formed at least in part by spray deposition of the sputtering material and/or welding.

30 Claims, 14 Drawing Sheets

(56) References Cited

U.S. PATENT DOCUMENTS

| | | | |
|---|---|---|---|
| 4,073,427 A | 2/1978 | Keifert et al. |
| 4,135,286 A | 1/1979 | Wright et al. |
| 4,140,172 A | 2/1979 | Corey |
| 4,141,127 A | 2/1979 | Cretella et al. |
| 4,202,932 A | 5/1980 | Chen et al. |
| 4,209,375 A | 6/1980 | Gates et al. |
| 4,291,104 A | 9/1981 | Keifert |
| 4,349,954 A | 9/1982 | Banks |
| 4,425,483 A | 1/1984 | Lee et al. |
| 4,435,483 A | 3/1984 | Ahslund et al. |
| 4,459,062 A | 7/1984 | Siebert |
| 4,483,819 A | 11/1984 | Albrecht et al. |
| 4,508,563 A | 4/1985 | Bernard et al. |
| 4,510,171 A | 4/1985 | Siebert |
| 4,537,641 A | 8/1985 | Albrecht et al. |
| 4,688,691 A | 8/1987 | Christian |
| 4,722,756 A | 2/1988 | Hard |
| 4,731,111 A | 3/1988 | Kopatz et al. |
| 4,818,629 A | 4/1989 | Jenstrom et al. |
| 4,905,886 A | 3/1990 | Kennedy et al. |
| 4,915,745 A | 4/1990 | Pollock et al. |
| 4,923,531 A | 5/1990 | Fisher |
| 4,964,906 A | 10/1990 | Fife |
| 4,983,269 A | 1/1991 | Wegmann |
| 5,061,527 A | 10/1991 | Watanabe et al. |
| 5,091,244 A | 2/1992 | Biornard |
| 5,147,125 A | 9/1992 | Austin |
| 5,160,534 A | 11/1992 | Hiraki |
| 5,242,481 A | 9/1993 | Kumar |
| 5,269,899 A | 12/1993 | Fan |
| 5,270,858 A | 12/1993 | Dickey |
| 5,271,965 A | 12/1993 | Browning |
| 5,302,414 A | 4/1994 | Alkhimov et al. |
| 5,305,946 A | 4/1994 | Heilmann |
| 5,330,798 A | 7/1994 | Browning |
| 5,392,981 A | 2/1995 | Makowiecki et al. |
| 5,428,882 A | 7/1995 | Makowiecki et al. |
| 5,466,355 A | 11/1995 | Ohhashi et al. |
| 5,554,889 A | 9/1996 | Shin et al. |
| 5,565,071 A | 10/1996 | Demaray et al. |
| 5,580,516 A | 12/1996 | Kumar |
| 5,612,254 A | 3/1997 | Mu et al. |
| 5,676,803 A | 10/1997 | Demaray et al. |
| 5,679,473 A | 10/1997 | Murayama et al. |
| 5,687,600 A | 11/1997 | Emigh et al. |
| 5,693,203 A | 12/1997 | Ohhashi et al. |
| 5,726,410 A | 3/1998 | Fukushima et al. |
| 5,738,770 A | 4/1998 | Strauss et al. |
| 5,766,544 A | 6/1998 | Kemp |
| 5,795,626 A | 8/1998 | Gabel et al. |
| 5,836,506 A | 11/1998 | Hunt et al. |
| 5,859,654 A | 1/1999 | Radke et al. |
| 5,863,398 A | 1/1999 | Kardokus et al. |
| 5,954,856 A | 9/1999 | Pathare et al. |
| 5,955,685 A | 9/1999 | Na |
| 5,972,065 A | 10/1999 | Dunn et al. |
| 5,993,513 A | 11/1999 | Fife |
| 6,010,583 A | 1/2000 | Annavarapu et al. |
| 6,030,577 A | 2/2000 | Commandeur et al. |
| 6,071,323 A | 6/2000 | Kawaguchi |
| 6,071,389 A | 6/2000 | Zhang |
| 6,136,062 A | 10/2000 | Loffelholz et al. |
| 6,139,913 A | 10/2000 | Van Steenkiste et al. |
| 6,165,413 A | 12/2000 | Lo et al. |
| 6,171,363 B1 | 1/2001 | Shekhter et al. |
| 6,176,947 B1 | 1/2001 | Hwang et al. |
| 6,189,663 B1 | 2/2001 | Smith et al. |
| 6,197,082 B1 | 3/2001 | Dorvel et al. |
| 6,238,456 B1 | 5/2001 | Wolf et al. |
| 6,245,390 B1 | 6/2001 | Baranovski et al. |
| 6,258,402 B1 | 7/2001 | Hussary et al. |
| 6,261,337 B1 | 7/2001 | Kumar |
| 6,267,851 B1 | 7/2001 | Hosokawa |
| 6,269,536 B1 | 8/2001 | Balliett |
| 6,283,357 B1 | 9/2001 | Kulkarni et al. |
| 6,294,246 B1 | 9/2001 | Watanabe et al. |
| 6,328,927 B1 | 12/2001 | Lo et al. |
| 6,331,233 B1 | 12/2001 | Turner |
| 6,408,928 B1 | 6/2002 | Heinrich et al. |
| 6,409,897 B1 | 6/2002 | Wingo |
| 6,409,965 B1 | 6/2002 | Nagata et al. |
| 6,413,578 B1 | 7/2002 | Stowell et al. |
| 6,432,804 B1 | 8/2002 | Nakata et al. |
| 6,444,259 B1 | 9/2002 | Subramanian et al. |
| 6,464,933 B1 | 10/2002 | Popoola et al. |
| 6,478,902 B2 | 11/2002 | Koenigsmann et al. |
| 6,482,743 B1 | 11/2002 | Sato |
| 6,491,208 B2 | 12/2002 | James et al. |
| 6,497,797 B1 | 12/2002 | Kim |
| 6,502,767 B2 | 1/2003 | Kay et al. |
| 6,521,173 B2 | 2/2003 | Kumar et al. |
| 6,558,447 B1 | 5/2003 | Shekhter et al. |
| 6,582,572 B2 | 6/2003 | McLeod |
| 6,589,311 B1 | 7/2003 | Han et al. |
| 6,589,377 B2 | 7/2003 | Vodermayer et al. |
| 6,592,935 B2 | 7/2003 | Leonardi et al. |
| 6,623,796 B1 | 9/2003 | Van Steenkiste |
| 6,635,219 B2 | 10/2003 | Wen et al. |
| 6,669,782 B1 | 12/2003 | Thakur |
| 6,673,220 B2 * | 1/2004 | Voutsas ............... C23C 14/3407 204/298.13 |
| 6,722,584 B2 | 4/2004 | Kay et al. |
| 6,723,379 B2 | 4/2004 | Stark |
| 6,725,522 B1 | 4/2004 | Ivanov et al. |
| 6,743,343 B2 | 6/2004 | Kida et al. |
| 6,743,468 B2 | 6/2004 | Fuller et al. |
| 6,748,902 B1 | 6/2004 | Boesch et al. |
| 6,749,002 B2 | 6/2004 | Grinberg et al. |
| 6,749,103 B1 | 6/2004 | Ivanov et al. |
| 6,759,085 B2 | 7/2004 | Muehlberger |
| 6,770,154 B2 | 8/2004 | Koenigsmann et al. |
| 6,773,969 B2 | 8/2004 | Lee et al. |
| 6,780,458 B2 | 8/2004 | Seth et al. |
| 6,855,236 B2 | 2/2005 | Sato et al. |
| 6,872,425 B2 | 3/2005 | Kaufold et al. |
| 6,872,427 B2 | 3/2005 | Van Steenkiste et al. |
| 6,875,324 B2 | 4/2005 | Hara et al. |
| 6,896,933 B2 | 5/2005 | Van Steenkiste et al. |
| 6,905,728 B1 | 6/2005 | Hu et al. |
| 6,911,124 B2 | 6/2005 | Tang et al. |
| 6,915,964 B2 | 7/2005 | Tapphorn et al. |
| 6,919,275 B2 | 7/2005 | Chiang et al. |
| 6,924,974 B2 | 8/2005 | Stark |
| 6,946,039 B1 | 9/2005 | Segal et al. |
| 6,953,742 B2 | 10/2005 | Chen et al. |
| 6,962,407 B2 | 11/2005 | Yamamoto et al. |
| 6,992,261 B2 | 1/2006 | Kachalov et al. |
| 7,041,204 B1 | 5/2006 | Cooper |
| 7,053,294 B2 | 5/2006 | Tuttle et al. |
| 7,066,375 B2 | 6/2006 | Bolser |
| 7,067,197 B2 | 6/2006 | Michaluk et al. |
| 7,081,148 B2 | 7/2006 | Koenigsmann et al. |
| 7,101,447 B2 | 9/2006 | Turner |
| 7,108,893 B2 | 9/2006 | Van Steenkiste et al. |
| 7,128,988 B2 | 10/2006 | Lambeth |
| 7,143,967 B2 | 12/2006 | Heinrich et al. |
| 7,146,703 B2 | 12/2006 | Ivanov |
| 7,153,453 B2 | 12/2006 | Abe et al. |
| 7,163,715 B1 | 1/2007 | Kramer |
| 7,164,205 B2 | 1/2007 | Yamaji et al. |
| 7,170,915 B2 | 1/2007 | McDonald |
| 7,175,802 B2 | 2/2007 | Sandlin et al. |
| 7,178,744 B2 | 2/2007 | Tapphorn et al. |
| 7,183,206 B2 | 2/2007 | Shepard |
| 7,192,623 B2 | 3/2007 | Andre et al. |
| 7,208,230 B2 | 4/2007 | Ackerman et al. |
| 7,244,466 B2 | 7/2007 | Van Steenkiste |
| 7,278,353 B2 | 10/2007 | Langan et al. |
| 7,314,650 B1 | 1/2008 | Nanis |
| 7,316,763 B2 | 1/2008 | Hosokawa et al. |
| 7,335,341 B2 | 2/2008 | Van Steenkiste et al. |
| 7,351,450 B2 | 4/2008 | Fuller et al. |
| 7,399,355 B2 | 7/2008 | Shekhter et al. |
| 7,399,355 B2 | 7/2008 | Szymanski et al. |

(56) References Cited

U.S. PATENT DOCUMENTS

| | | |
|---|---|---|
| 7,402,277 B2 | 7/2008 | Ayer et al. |
| 7,479,299 B2 | 1/2009 | Raybould et al. |
| 7,504,008 B2 | 3/2009 | Doan et al. |
| 7,514,122 B2 | 4/2009 | Kramer |
| 7,550,055 B2 | 6/2009 | Le et al. |
| 7,582,846 B2 | 9/2009 | Molz et al. |
| 7,618,500 B2 | 11/2009 | Farmer et al. |
| 7,635,498 B2 | 12/2009 | Sakai et al. |
| 7,644,745 B2 | 1/2010 | Le et al. |
| 7,651,658 B2 | 1/2010 | Aimone et al. |
| 7,652,223 B2 | 1/2010 | Tanase et al. |
| 7,670,406 B2 | 3/2010 | Belashchenko |
| 7,794,554 B2 | 9/2010 | Aimone et al. |
| 7,811,429 B2 | 10/2010 | Landgraf et al. |
| 7,815,782 B2 | 10/2010 | Inagawa et al. |
| 7,871,563 B2 | 1/2011 | Acker et al. |
| 7,901,552 B2 | 3/2011 | Pavloff |
| 7,910,051 B2 | 3/2011 | Zimmermann et al. |
| 7,951,275 B2 | 5/2011 | Tsukamoto |
| 8,002,169 B2 | 8/2011 | Miller et al. |
| 8,022,169 B2 | 9/2011 | Way et al. |
| 8,043,655 B2 | 10/2011 | Miller et al. |
| 8,082,768 B2 | 12/2011 | Hidaka et al. |
| 8,113,413 B2 | 2/2012 | Miller et al. |
| 8,173,206 B2 | 5/2012 | Boutwell et al. |
| 8,187,720 B2 | 5/2012 | Choi et al. |
| 8,197,661 B1 | 6/2012 | Nanis |
| 8,197,894 B2 | 6/2012 | Miller et al. |
| 8,226,741 B2 | 7/2012 | Shekhter et al. |
| 8,246,903 B2 | 8/2012 | Miller et al. |
| 8,448,840 B2 | 5/2013 | Miller et al. |
| 8,491,959 B2 | 7/2013 | Miller et al. |
| 8,715,386 B2 | 5/2014 | Shekhter et al. |
| 8,734,896 B2 | 5/2014 | Volchko et al. |
| 8,777,090 B2 | 7/2014 | Miller et al. |
| 8,883,250 B2 | 11/2014 | Miller et al. |
| 8,961,867 B2 | 2/2015 | Miller et al. |
| 2001/0054457 A1 | 12/2001 | Segal et al. |
| 2002/0041819 A1 | 4/2002 | Kumar et al. |
| 2002/0066770 A1 | 6/2002 | James et al. |
| 2002/0090464 A1 | 7/2002 | Jiang et al. |
| 2002/0112789 A1 | 8/2002 | Jepson et al. |
| 2002/0112955 A1 | 8/2002 | Aimone et al. |
| 2002/0168466 A1 | 11/2002 | Tapphorn et al. |
| 2003/0019326 A1 | 1/2003 | Han et al. |
| 2003/0023132 A1 | 1/2003 | Melvin et al. |
| 2003/0052000 A1 | 3/2003 | Segal et al. |
| 2003/0082297 A1 | 5/2003 | Wolkers et al. |
| 2003/0121777 A1 | 7/2003 | Sato et al. |
| 2003/0175142 A1 | 9/2003 | Milonopoulou et al. |
| 2003/0178301 A1 | 9/2003 | Lynn et al. |
| 2003/0190413 A1 | 10/2003 | Van Steenkiste et al. |
| 2003/0219542 A1 | 11/2003 | Ewasyshyn et al. |
| 2003/0232132 A1 | 12/2003 | Muehlberger |
| 2004/0037954 A1 | 2/2004 | Heinrich et al. |
| 2004/0065545 A1 | 4/2004 | Takahashi |
| 2004/0065546 A1 | 4/2004 | Michaluk et al. |
| 2004/0076807 A1 | 4/2004 | Grinberg et al. |
| 2004/0107798 A1 | 6/2004 | Hirata et al. |
| 2004/0126499 A1 | 7/2004 | Heinrich et al. |
| 2004/0141870 A1 | 7/2004 | Michaluk et al. |
| 2004/0202885 A1 | 10/2004 | Seth et al. |
| 2004/0262157 A1 | 12/2004 | Ford et al. |
| 2005/0084701 A1 | 4/2005 | Slattery |
| 2005/0120957 A1 | 6/2005 | Kowalsky et al. |
| 2005/0142021 A1 | 6/2005 | Aimone et al. |
| 2005/0147150 A1 | 7/2005 | Wickersham et al. |
| 2005/0147742 A1 | 7/2005 | Kleshock et al. |
| 2005/0153069 A1 | 7/2005 | Tapphorn et al. |
| 2005/0155856 A1 | 7/2005 | Oda |
| 2005/0199739 A1 | 9/2005 | Kuroda et al. |
| 2005/0220995 A1 | 10/2005 | Hu et al. |
| 2005/0252450 A1 | 11/2005 | Kowalsky et al. |
| 2006/0006064 A1 | 1/2006 | Tepman |
| 2006/0011470 A1 | 1/2006 | Hatch et al. |
| 2006/0011740 A1 | 1/2006 | Bosio |
| 2006/0021870 A1 | 2/2006 | Tsai et al. |
| 2006/0027687 A1 | 2/2006 | Heinrich et al. |
| 2006/0032735 A1 | 2/2006 | Aimone et al. |
| 2006/0032737 A1 | 2/2006 | Liehr |
| 2006/0042728 A1 | 3/2006 | Lemon et al. |
| 2006/0045785 A1 | 3/2006 | Hu et al. |
| 2006/0090593 A1 | 5/2006 | Liu |
| 2006/0121187 A1 | 6/2006 | Haynes et al. |
| 2006/0129941 A1 | 6/2006 | Hollemans |
| 2006/0137969 A1 | 6/2006 | Feldewerth et al. |
| 2006/0175198 A1 | 8/2006 | Vermeersch et al. |
| 2006/0207876 A1 | 9/2006 | Matsumura et al. |
| 2006/0251872 A1 | 11/2006 | Wang et al. |
| 2006/0266639 A1* | 11/2006 | Le ................... C23C 14/3407 204/192.1 |
| 2006/0289305 A1 | 12/2006 | White |
| 2007/0012557 A1 | 1/2007 | Hosokawa et al. |
| 2007/0089984 A1 | 4/2007 | Gaydos et al. |
| 2007/0116886 A1 | 5/2007 | Refke et al. |
| 2007/0116890 A1 | 5/2007 | Adams et al. |
| 2007/0125646 A1 | 6/2007 | Young et al. |
| 2007/0172378 A1 | 7/2007 | Shibuya et al. |
| 2007/0183919 A1 | 8/2007 | Ayer et al. |
| 2007/0187525 A1 | 8/2007 | Jabado et al. |
| 2007/0196570 A1 | 8/2007 | Gentsch et al. |
| 2007/0240980 A1 | 10/2007 | Chu et al. |
| 2007/0241164 A1 | 10/2007 | Barnes et al. |
| 2007/0251814 A1 | 11/2007 | Beele et al. |
| 2007/0251820 A1* | 11/2007 | Nitta et al. ............... 204/298.13 |
| 2007/0269608 A1 | 11/2007 | Saito et al. |
| 2007/0289689 A1 | 12/2007 | Sugimoto et al. |
| 2007/0289864 A1 | 12/2007 | Ye et al. |
| 2007/0289869 A1 | 12/2007 | Ye et al. |
| 2008/0028459 A1 | 1/2008 | Suh et al. |
| 2008/0041720 A1 | 2/2008 | Kim et al. |
| 2008/0063889 A1 | 3/2008 | Duckham et al. |
| 2008/0078268 A1 | 4/2008 | Shekhter et al. |
| 2008/0110746 A1 | 5/2008 | Kardokus et al. |
| 2008/0145688 A1 | 6/2008 | Miller et al. |
| 2008/0171215 A1 | 7/2008 | Kumar et al. |
| 2008/0173542 A1 | 7/2008 | Neudecker et al. |
| 2008/0216602 A1 | 9/2008 | Zimmermann et al. |
| 2008/0271779 A1 | 11/2008 | Miller et al. |
| 2009/0004379 A1 | 1/2009 | Deng et al. |
| 2009/0010792 A1 | 1/2009 | Yi et al. |
| 2009/0022616 A1 | 1/2009 | Acker et al. |
| 2009/0159433 A1 | 6/2009 | Neudecker et al. |
| 2009/0173626 A1 | 7/2009 | Duckham et al. |
| 2009/0214374 A1 | 8/2009 | Ivanov |
| 2009/0239754 A1 | 9/2009 | Kruger et al. |
| 2009/0291851 A1 | 11/2009 | Bohn |
| 2010/0000857 A1 | 1/2010 | Tonogi et al. |
| 2010/0015467 A1 | 1/2010 | Zimmermann et al. |
| 2010/0055487 A1 | 3/2010 | Zimmermann et al. |
| 2010/0061876 A1 | 3/2010 | Miller et al. |
| 2010/0084052 A1 | 4/2010 | Farmer et al. |
| 2010/0086800 A1 | 4/2010 | Miller et al. |
| 2010/0136242 A1 | 6/2010 | Kay et al. |
| 2010/0172789 A1 | 7/2010 | Calla et al. |
| 2010/0189910 A1 | 7/2010 | Belashchenko |
| 2010/0246774 A1 | 9/2010 | Lathrop |
| 2010/0252418 A1 | 10/2010 | McCabe et al. |
| 2010/0272889 A1 | 10/2010 | Shekhter et al. |
| 2011/0127162 A1 | 6/2011 | King et al. |
| 2011/0132534 A1 | 6/2011 | Miller et al. |
| 2011/0256013 A1 | 10/2011 | Yamamoto et al. |
| 2011/0297535 A1 | 12/2011 | Higdon et al. |
| 2011/0300396 A1 | 12/2011 | Miller et al. |
| 2011/0303535 A1 | 12/2011 | Miller et al. |
| 2012/0000594 A1 | 1/2012 | Ivanov et al. |
| 2012/0017521 A1 | 1/2012 | Botke |
| 2012/0061235 A1 | 3/2012 | Feldman-Peabody |
| 2012/0251714 A1 | 10/2012 | Miller et al. |
| 2012/0291592 A1 | 11/2012 | Shekhter et al. |
| 2012/0315387 A1 | 12/2012 | Miller et al. |
| 2013/0081943 A1 | 4/2013 | Loewenthal et al. |
| 2013/0082033 A1 | 4/2013 | Volchko et al. |
| 2013/0156967 A1 | 6/2013 | Michaluk et al. |

(56) References Cited

U.S. PATENT DOCUMENTS

| | | | |
|---|---|---|---|
| 2013/0264013 | A1 | 10/2013 | Miller et al. |
| 2013/0302519 | A1 | 11/2013 | Miller et al. |
| 2013/0337159 | A1 | 12/2013 | Miller et al. |
| 2014/0311669 | A1 | 10/2014 | Miller et al. |
| 2015/0034477 | A1 | 2/2015 | Miller et al. |

FOREIGN PATENT DOCUMENTS

| | | | |
|---|---|---|---|
| CN | 104040020 A | | 9/2014 |
| DE | 10253794 A1 | | 6/2004 |
| EP | 0 074 803 A1 | | 3/1983 |
| EP | 0212929 A2 | | 3/1987 |
| EP | 0 484 533 A1 | | 5/1992 |
| EP | 0 774 315 A2 | | 5/1997 |
| EP | 0911426 A1 | | 4/1999 |
| EP | 1 066 899 A2 | | 1/2001 |
| EP | 1 138 420 A2 | | 10/2001 |
| EP | 1314795 A1 | | 5/2003 |
| EP | 1 350 861 A1 | | 10/2003 |
| EP | 1 382 720 A2 | | 1/2004 |
| EP | 1 398 394 A1 | | 3/2004 |
| EP | 1 413 642 A1 | | 4/2004 |
| EP | 1 452 622 A2 | | 9/2004 |
| EP | 1200218 B1 | | 7/2005 |
| EP | 1556526 A2 | | 7/2005 |
| EP | 1639620 A2 | | 3/2006 |
| EP | 1672175 A1 | | 6/2006 |
| EP | 1 715 080 A1 | | 10/2006 |
| EP | 1728892 A2 | | 12/2006 |
| EP | 2135973 A1 | | 12/2009 |
| EP | 2145976 A1 | | 1/2010 |
| EP | 2 206 804 A1 | | 7/2010 |
| EP | 2278045 A1 | | 1/2011 |
| EP | 2328701 A4 | | 4/2013 |
| EP | 2706129 A1 | | 3/2014 |
| EP | 2818577 A1 | | 12/2014 |
| GB | 2 121 441 A | | 12/1983 |
| GB | 2 394 479 A | | 4/2004 |
| JP | 54067198 A | | 5/1979 |
| JP | 59020470 A | * | 2/1984 |
| JP | 62-230967 A | | 10/1987 |
| JP | 63035769 A | | 2/1988 |
| JP | 63100177 A | | 5/1988 |
| JP | 63 227774 | | 9/1988 |
| JP | 63227774 A | * | 9/1988 |
| JP | 64-15353 A | | 1/1989 |
| JP | 03197640 A | | 8/1991 |
| JP | 4-323366 A | | 11/1992 |
| JP | 05/015915 A | | 1/1993 |
| JP | 05/232580 A | | 9/1993 |
| JP | 06/144124 A | | 5/1994 |
| JP | 6-158300 A | | 6/1994 |
| JP | 6-346232 A | | 12/1994 |
| JP | 06346232 A | | 12/1994 |
| JP | 7-228966 A | | 8/1995 |
| JP | 08/169464 A | | 7/1996 |
| JP | 10-275887 | | 10/1998 |
| JP | 11-69637 A | | 3/1999 |
| JP | 11-256323 A | | 9/1999 |
| JP | 11269637 A | | 10/1999 |
| JP | 11269639 A | | 10/1999 |
| JP | 11-312484 A | | 11/1999 |
| JP | 2000-256843 A | | 9/2000 |
| JP | 2001-107228 A | | 4/2001 |
| JP | 2001098359 A | | 4/2001 |
| JP | 01/131767 | | 5/2001 |
| JP | 2001123267 A | | 5/2001 |
| JP | 03/301278 B2 | | 7/2002 |
| JP | 2003201561 A | | 7/2003 |
| JP | 2003226966 A | | 8/2003 |
| JP | 2004-523653 A | | 8/2004 |
| JP | 2004-307969 A | | 11/2004 |
| JP | 2005-29858 A | | 2/2005 |
| JP | 3-108347 U | | 4/2005 |
| JP | 2005-95886 A | | 4/2005 |
| JP | 2006-52440 A | | 2/2006 |
| JP | 2006-161161 A | | 6/2006 |
| JP | 2006144124 A | | 6/2006 |
| JP | 2007-76705 A | | 3/2007 |
| JP | 2007-146281 A | | 6/2007 |
| JP | 59 020470 | | 11/2007 |
| JP | 2008-169464 A | | 7/2008 |
| JP | 2008-540823 A | | 11/2008 |
| JP | 2009221543 A | | 10/2009 |
| JP | 2013-224495 A | | 10/2013 |
| JP | 2015-505907 A | | 2/2015 |
| KR | 10-0683124 B1 | | 2/2007 |
| KR | 10-2008-0006624 A | | 1/2008 |
| KR | 2010 0108673 | | 10/2010 |
| RU | 2166421 C1 | | 5/2001 |
| WO | WO-93/19220 A1 | | 9/1993 |
| WO | WO-96/33294 A1 | | 10/1996 |
| WO | WO-98/37249 A1 | | 8/1998 |
| WO | WO-00/06793 A1 | | 2/2000 |
| WO | WO-01/12364 A1 | | 2/2001 |
| WO | WO-02/064287 A2 | | 8/2002 |
| WO | WO-02/070765 A1 | | 9/2002 |
| WO | WO-03/062491 A2 | | 7/2003 |
| WO | WO-03/106051 A1 | | 12/2003 |
| WO | WO-03/106733 A1 | | 12/2003 |
| WO | WO-03106733 A1 | | 12/2003 |
| WO | 2004/009866 A1 | | 1/2004 |
| WO | WO-2004/074540 A1 | | 9/2004 |
| WO | WO-2004/076706 A2 | | 9/2004 |
| WO | WO-2004/114355 A2 | | 12/2004 |
| WO | WO-2005/073418 A1 | | 8/2005 |
| WO | WO-2005/079209 A2 | | 9/2005 |
| WO | WO-2005/084242 A2 | | 9/2005 |
| WO | WO-2006/117144 A1 | | 11/2006 |
| WO | WO-2006/117145 A2 | | 11/2006 |
| WO | WO-2006129941 A1 | | 12/2006 |
| WO | WO-2007/001441 A2 | | 1/2007 |
| WO | WO-2008/033192 A1 | | 3/2008 |
| WO | WO-2008/042947 A2 | | 4/2008 |
| WO | WO-2008/063891 A2 | | 5/2008 |
| WO | 2008/081585 A1 | | 7/2008 |
| WO | WO-2008/089188 A1 | | 7/2008 |
| WO | 2009/012278 A1 | | 1/2009 |
| WO | 2012/074609 A1 | | 6/2012 |

OTHER PUBLICATIONS

International Search Report mailed Apr. 25, 2013 for International Application No. PCT/JP2012/057434 (7 pages).
Examination Report received for Canadian Application No. 2,736,876, mailed on Jan. 23, 2013, 3 pages.
Examination Report received for Japanese Application No. 2011-526142, mailed on Feb. 13, 2013, 12 pages (7 pages of English Translation & 5 pages of Official copy).
Examination Report received for European Patent Application No. 07843733.2, mailed on Oct. 11, 2013, 4 pages.
Examination Report received for European Patent Application No. 09813462.0, mailed on Oct. 1, 2013, 4 pages.
Examination Report Received for European Patent Application No. 09813462.0, mailed on Feb. 6, 2014, 4 pages.
Extended European Search Report Received for European Patent Application No. 13184639.6, mailed on Feb. 10, 2014, 6 pages.
Examination Report Received for Japanese Patent Application No. 2009-232394, mailed on Jan. 27, 2014, 9 pages of English Translation only.
Examination Report Received for Japanese Patent Application No. 2009-232394, mailed on Sep. 24, 2013, 8 pages of English Translation only.
Examination Report received for Korean Application No. 10-2009-7025319 mailed on Dec. 2, 2013, 5 pages (2 pages of English Translation & 3 page of Official Copy).
International Preliminary Report on Patentability received for PCT Patent Application No. PCT/US2012/057434, mailed on Apr. 10, 2014, 12 pages.
International Preliminary Report on Patentability received for PCT Patent Application No. PCT/US2012/069401, mailed on Jun. 26, 2014, 7 pages.

(56) References Cited

OTHER PUBLICATIONS

International Search Report and Written Opinion received for PCT Patent Application No. PCT/US2012/069401, mailed on Mar. 20, 2013, 9 pages.

Kwon, et al., "Particle Behavior in Supersonic Flow During the Cold Spray Process", Metals and Materials International, vol. 11, No. 5, 2005, pp. 377-381.

Notice of Allowance Received for Korean Patent Application No. KR 10-2009-0094709, mailed on Jul. 29, 2014, 3 pages (1 page of English Translation & 2 pages of official copy).

U.S. Appl. No. 14/293,643, filed Jun. 2, 2014 by Steven A. Miller et al.; Non Final Office Action mailed Dec. 23, 2014.

"Cold Gas Dynamic Spray CGSM Apparatus," Tev Tech LLC, available at: http://www.tevtechllc.com/cold_gas.html (accessed Dec. 14, 2009).

"Cold Spray Process," Handbook of Thermal Spray Technology, ASM International, Sep. 2004, pp. 77-84.

Ajdelsztajn et al., "Synthesis and Mechanical Properties of Nanocrytalline Ni Coatings Producted by Cold Gas Dynamic Spraying," 201 Surface and Coatings Tech. 3-4, pp. 1166-1172 (Oct. 2006).

Examination Report in European Patent Application No. 09172234.8, mailed Jun. 16, 2010 (3 pages).

Gärtner et al.,"The Cold Spray Process and its Potential for Industrial Applications," 15 J. of Thermal Sprsy Tech. 2, pp. 223-232 (Jun. 2006).

Hall et al., "The Effect of a Simple Annealing Heat Treatment on the Mechanical Properties of Cold-Sprayed Aluminum," 15 J. of Thermal Spray Tech. 2, pp. 233-238 (Jun. 2006.).

Hall et al., "Preparation of Aluminum Coatings Containing Homogeneous Nanocrystalline Microstructures Using the Cold Spray Process," JTTEES 17:352-359.

IPRP in International Patent Application No. PCT/EP2006/003967, dated Nov. 6, 2007 (15 pages).

IPRP in International Patent Application No. PCT/US2008/062434, dated Nov. 10, 2009 (21 pages).

IPRP in International Patent Application No. PCT/EP2006/003969, mailed dated Nov. 6, 2007 (13 pages).

International Search Report and Written Opinion in International Patent Application No. PCT/US2007/087214, mailed Mar. 23, 2009 (13 pages).

IPRP in International Patent Application No. PCT/US2007/081200, dated Sep. 1, 2009 (17 pages).

IPRP in International Patent Application No. PCT/US2007/080282, dated Apr. 7, 2009 (15 pages).

Irissou et al., "Review on Cold Spray Process and Technology: Part I—Intellectual Property," 17 J. of Thermal Spray Tech. 4, pp. 495-516 (Dec. 2008).

Karthikeyan, "Cold Spray Technology: International Status and USA Efforts," ASB Industries, Inc. (Dec. 2004).

Li et al., "Effect of Annealing Treatment on the Microstructure and Properties of Cold-Sprayed Cu Coating," 15 J. of Thermal Spray Tech. 2, pp. 206-211 (Jun. 2006).

Marx et al., "Cold Spraying—Innovative Layers for New Applications," 15 J. of Thermal Spray Tech. 2, pp. 177-183 (Jun. 2006).

Morito, "Preparation and Characterization of Sintered Mo-Re Alloys," 3 J. de Physique 7, Part 1, pp. 553-556 (1993).

Search Report in European Patent Application No. 09172234.8, dated Jan. 29, 2010 (7 pages).

Stoltenhoff et al., "An Analysis of the Cold Spray Process and its Coatings," 11 J. of Thermal Spray Tech. 4, pp. 542-550 (Dec. 2002).

Van Steenkiste et al., "Analysis of Tantalum Coatings Produced by the Kinetic Spray Process," 13 J. of Thermal Spray Tech. 2, pp. 265-273 (Jun. 2004).

Kosarev et al., "Recently Patent Facilities and Applications in Cold Spray Engineering," Recent Patents on Engineering, vol. 1 pp. 35-42 (2007).

Examination Report in European Patent Application No. 07843733.2, mailed Nov. 30, 2010 (9 pages).

English Translation of Office Action mailed Feb. 23, 2011 for Chinese Patent Application No. 200880023411.5 (7 pages).

Examination Report in European Patent Application No. 08755010.9, mailed Sep. 16, 2011 (3 pages).

Examination Report in Canadian Patent Application No. 2,736,876, mailed Feb. 29, 2012 (4 pages).

Tapphorn et al., "The Solid-State Spray Forming of Low-Oxide Titanium Components," JOM, p. 45-47 (1998).

Office Action mailed Nov. 23, 2011 for Chinese Patent Application No. 200880023411.5 (3 pages).

English Translation of Office Action mailed Jun. 26, 2012 for Japanese Patent Application No. 2010-506677 (6 pages).

English Translation of Office Action mailed Sep. 7, 2010 for Chinese Patent Application No. 200780036469.9 (6 pages).

Examination Report Received for Japanese Patent App. No. 2013-266839 mailed on Oct. 22, 2014, 7 pages (4 pages of English Translation & 3 pages of Official copy).

Extended European Search Report received for European Patent Application No. 09813462.0, mailed on Mar. 8, 2013, 5 pages.

Extended European Search Report received for European Patent Application No. 14166073.8, mailed on Dec. 3, 2014, 7 pages.

Steenkiste et al., "Analysis of Tantalum Coatings Produced by the Kinetic Spray Process", Journal of Thermal Spray Technology, vol. 13, No. 2, Jun. 2004, pp. 265-273.

U.S. Appl. No. 12/513,715, filed Jul. 30, 2009 by Stefan Zimmermann et al.

U.S. Appl. No. 13/628,088, filed Sep. 27, 2012 by William Loewenthal et al.

U.S. Appl. No. 14/293,643, filed Jun. 2, 2014 by Steven A. Miller et al.

* cited by examiner

LARGE-AREA SPUTTERING TARGETS

RELATED APPLICATIONS

This application claims the benefit of and priority to U.S. Provisional Patent Application No. 61/540,644, filed Sep. 29, 2011, and U.S. Provisional Patent Application No. 61/648,333, filed May 17, 2012, the entire disclosure of each of which is hereby incorporated herein by reference.

TECHNICAL FIELD

In various embodiments, the present invention relates to methods of forming large sputtering targets, in particular by joining smaller sputtering-target tiles.

BACKGROUND

Sputtering, a physical-vapor-deposition technique, is utilized in many industries to deposit thin films of various materials with highly controllable composition and uniformity on any of a variety of substrates. However, for many applications, the size of the desired substrate continues to increase, necessitating the use of larger and larger sputtering targets during the sputtering process. Unfortunately, sputtering targets formed via conventional fabrication methods tends to be too small for many such applications, particularly if the sputtering-target material is a composite (i.e., a substantially uniform mixture of two or more elemental or compound components), as such composite sputtering targets are difficult or impossible to form with a high degree of uniformity by other methods such as rolling. For example, alloys or mixtures of molybdenum and titanium (Mo/Ti) are typically formed into billets for sputtering targets via hot isostatic pressing (HIP) of a mixture of Mo and Ti powders. The largest such billets tend to be smaller than the sputtering-target size desired for, e.g., sputtering of Mo/Ti films on large glass substrates for flat panel displays (FPDs). In order to provide sputtering targets of the requisite dimensions, multiple smaller targets are often positioned in close proximity to each other (but not otherwise joined together) to form a larger target. For example, for use in a "generation 7" sputtering tool, 12 planar plates having dimensions 2700 mm×200 mm×18 mm may be used to form a larger segmented target of approximate dimensions 2700 mm×2400 mm×18 mm.

Such segmented targets present many disadvantages in terms of particle generation (which results in expensive yield loss for the manufacturer) and film nonuniformity. Particle generation may occur preferentially along the edges of the individual sub-targets, and film uniformity tends to decrease as the edges of the target are approached and/or as the edges of the sub-targets are exposed to the sputtering process. Particle generation is a particular problem for FPDs, as each particle generated during the thin-film deposition process can cause a pixel to fail, which in turn has a deleterious impact on image quality and sharpness in the finished FPD.

Similarly, tubular (or "rotary") sputtering targets are frequently of a segmented design simply because some sputtering materials (e.g., tantalum (Ta) or composites such as Mo/Ti), generally cannot be formed in sufficiently long tubes. For example, in order to make a long rotary target, multiple short cylindrical tiles of the sputtering material are often simply slipped over and bonded to a tubular backing plate made from an easily formable material such as stainless steel or Ti. A single 2.7-meter tube may have six or more tiles, the edges (as many as 12) of which potentially generate contaminating particles. Particle generation is exacerbated in rotary sputtering machines, because such machines typically contain multiple tubular targets. For example, a "generation 8.5" sputtering tool typically contains 12 separate rotary targets, and thus 144 tile edges potentially generating particles.

Techniques such as electron-beam welding have been utilized in attempts to join sub-targets together to form a larger sputtering target, e.g., a composite target of a material such as Mo/Ti. However, electron-beam welding of Mo/Ti sputtering-target sections results in unacceptable porosity in the welded zone due to the relatively high gas (e.g., oxygen) content of the Mo and Ti in the plates. Furthermore, the electron-beam-welded zone tends to have a markedly different microstructure than that of the bulk of the target, which generally results in deleterious nonuniformity in films sputtered from such joined targets.

In view of the foregoing, there is a need for methods of joining smaller sputtering targets to form large joined targets with joints that are mechanically robust and that do not generate particles during sputtering of the joined target.

SUMMARY

In accordance with various embodiments of the present invention, large sputtering targets are formed by tiling together multiple smaller sputtering targets (or "tiles") each having a desired composition and joining the tiles at least partially by spray deposition (e.g., cold spray) and/or welding techniques. The present embodiments are particularly applicable to sputtering targets including or consisting essentially of composite materials or alloys such as Mo/Ti, tungsten/titanium (W/Ti), or copper/tungsten (Cu/W), and are also applicable to targets of a single material such as Ti, niobium (Nb), Ta, etc. The tiles may be, at least initially, shaped as rectangular prisms or cylinders with substantially right-angled corners. However, the tiles are generally not merely placed in close proximity and spray-coated at the seams therebetween, as such joints may have insufficient strength to withstand subsequent handling and processing. Rather, a shaped joint area is formed in at least one of the tiles at each interface or seam between tiles, and this joint area is at least partially filled and/or coated via spray deposition to form the joint. Such joints may advantageously have superior strength, resistance to particle formation, and microstructures and densities substantially resembling those of the joined plates. The spray-deposited portion of the joint enables the elimination of internal exposed "edges" in the larger joined targets. Such joined targets may have areal dimensions of at least 2800 mm×2500 mm (if planar), or even larger. Rotary joined targets in accordance with embodiments of the invention have lengths of 2.7 meters or even longer. However, joined sputtering targets having smaller areal dimensions or shorter lengths may also be produced in accordance to the embodiments of the invention. Typically the sputtering targets include or consist essentially of only the desired material to be sputtered, and after joining, the joined target is bonded to a backing plate, although in some embodiments the joining of the targets is performed directly on a backing plate. As used herein, a "backing plate" may be substantially planar, tubular, or cylindrical, depending on the geometry of the final desired sputtering target, and may include or consist essentially of one or more materials having a melting point less than that of the target material and/or less than the temperature of the spray material during spray deposition. Herein, references to the joining of two sputtering-target tiles (thereby forming an interface therebetween) are understood to include cases where more than two tiles are joined together at the same interface or at multiple different interfaces (and thus are not limited to cases in which only two tiles are joined), as such cases include the joining of various combinations of two different tiles.

The tiles to be joined may be fabricated with any one or more of a variety of techniques, including HIP, cold isostatic pressing (CIP), spray deposition, molding, etc. As mentioned above, the tiles may, at least initially, have rectangular prismatic or cylindrical shapes with substantially right-angled corners, and then shaped joints (e.g., bevels or chamfers) may be machined or otherwise introduced into the tiles prior to joining them together. Alternatively, the tiles may be initially shaped already incorporating the bevel (or other suitable shape for joining) via a process such as molding in a shaped mold.

In an aspect, embodiments of the invention feature a method of forming a joined sputtering target that includes or consists essentially of a sputtering material. Two discrete sputtering-target tiles, which include or consist essentially of the sputtering material, are disposed proximate each other to form an interface between the tiles. The interface includes a gap between the tiles. At least a portion of the gap is filled with a gap-fill material. A spray material is spray-deposited on at least a portion of the gap-fill material (as well as, e.g., a portion of one or both tiles) to form a partial joint. After formation of the partial joint, at least a portion of the gap-fill material is removed from the interface. After such removal, additional spray material is spray-deposited on at least a portion of the partial joint to join the tiles and form the joined sputtering target.

Embodiments of the invention may include one or more of the following in any of a variety of combinations. Filling the at least a portion of the gap with the gap-fill material may alter the microstructure of at least one of the tiles in a region proximate the interface. At least a portion of the altered-microstructure region may be removed prior to spray-depositing the spray material on at least a portion of the partial joint. The gap-fill material may include or consist essentially of a weld bead and/or a rod (which may be hollow) shaped to (and/or deformable to) fill at least a portion of the gap. The sputtering material may include or consist essentially of a mixture or alloy of at least two constituent materials. The gap-fill material may include or consist essentially of at least one (e.g., only one) of the constituent materials. The constituent materials may include or consist essentially of Mo and Ti. The spray material may include or consist essentially of at least one of (e.g., only one) of the constituent materials. The spray material may include or consist essentially of the sputtering material. The tiles may consist essentially of the sputtering material. The gap-fill material may include or consist essentially of the sputtering material. At least a portion of each of the two tiles may be substantially planar (and the joined target may be substantially planar). At least a portion of each of the two tiles may be substantially tubular (and the joined target may be substantially tubular).

The interface may include at least one recess defined by a beveled surface of at least one of the two tiles. The spray material may substantially fill the at least one recess to form a surface substantially coplanar with a surface of at least one of the tiles. The beveled surface may be reentrant. At least a portion of the beveled surface may be substantially planar and form an angle of greater than 45° with respect to the normal to the top surface of the joined sputtering target. The angle may be selected from the range of 45° to 60°. Spray material may be spray deposited on the gap-fill material or on the partial joint at an angle approximately perpendicular to the beveled surface. Spray material may be spray deposited on the gap-fill material or on the partial joint by (i) spray-depositing a first portion of the spray material at an angle approximately perpendicular to the beveled surface and (ii) thereafter, spray-depositing a second portion of the spray material at an angle approximately perpendicular to the top surface of the joined sputtering target. After its formation, the joined sputtering target may be annealed at a temperature selected from the range of approximately 480° C. to approximately 1425° C., or at a temperature selected from the range of approximately 1100° C. to approximately 1425° C. The joined sputtering target may be disposed on a backing plate after formation of the joined sputtering target. The joined sputtering target may be heat treated at least proximate the spray material. The spray material may be spray-deposited on the gap-fill material and/or on the partial joint by cold spray.

In another aspect, embodiments of the invention feature a method of forming a joined sputtering target that includes or consists essentially of a sputtering material. A mechanical joint is formed between two discrete sputtering-target tiles by overlapping and/or interlocking the tiles at an interface therebetween. The interface includes a recess over the mechanical joint. The tiles are joined by welding the mechanical joint. Thereafter, a spray material is spray-deposited over at least a portion of the welded mechanical joint to substantially fill at least a portion of the recess, thereby forming the joined sputtering target.

Embodiments of the invention may include one or more of the following in any of a variety of combinations. Welding the mechanical joint may include or consist essentially of resistance seam welding. The sputtering material may include or consist essentially of a mixture or alloy of at least two constituent materials. Welding the mechanical joint may include or consist essentially of melting at least one constituent material while at least one other constituent material remains unmelted. The constituent materials may include or consist essentially of Mo and Ti. The spray material may include or consist essentially of at least one of (e.g., only one) of the constituent materials. The spray material may include or consist essentially of the sputtering material. The tiles may consist essentially of the sputtering material. The mechanical joint may include or consist essentially of an interlocking joint that includes or consists essentially of a tongue-in-groove joint, a dovetail joint, a rabbet joint, a finger joint, or a spline joint. At least a portion of each of the two tiles may be substantially planar (and the joined target may be substantially planar). At least a portion of each of the two tiles may be substantially tubular (and the joined target may be substantially tubular).

The recess may be defined by a beveled surface of at least one of the two tiles. The beveled surface may be reentrant. At least a portion of the beveled surface may be substantially planar and form an angle of greater than 45° with respect to the normal to the top surface of the joined sputtering target. The angle may be selected from the range of 45° to 60°. Spray material may be spray deposited at an angle approximately perpendicular to the beveled surface. Spray material may be spray deposited by (i) spray-depositing a first portion of the spray material at an angle approximately perpendicular to the beveled surface and (ii) thereafter, spray-depositing a second portion of the spray material at an angle approximately perpendicular to the top surface of the joined sputtering target. After its formation, the joined sputtering target may be annealed at a temperature selected from the range of approximately 480° C. to approximately 1425° C., or at a temperature selected from the range of approximately 1100° C. to approximately 1425° C. The joined sputtering target may be disposed on a backing plate after formation of the joined sputtering target. The joined sputtering target may be heat treated at least proximate the spray material. The spray material may be spray-deposited by cold spray.

In yet another aspect, embodiments of the invention feature a method of forming a joined sputtering target that includes or consists essentially of a sputtering material. Two discrete sputtering-target tiles are disposed substantially in contact at an interface therebetween. A first welding electrode is disposed above the interface, and a second welding electrode is disposed below the interface. The first welding electrode is translated along at least portions of top surfaces of the tiles along the interface while, simultaneously, the second welding electrode is translated along at least portions of bottom surfaces of the tiles along the interface. The first welding electrode remains disposed substantially above the second welding electrode as the electrodes are translated. During at least part of the translation of the first and second welding electrodes, an electrical current is passed through the tiles between the first and second welding electrodes to weld the tiles together at the interface, thereby forming the joined sputtering target.

Embodiments of the invention may include one or more of the following in any of a variety of combinations. A spray material may be spray-deposited on at least a portion of at least one of the tiles prior to disposing the tiles substantially in contact. The spray material may be disposed at the interface after the tiles are disposed substantially in contact. The spray material may include or consist essentially of the sputtering material. The sputtering material may include or consist essentially of a mixture or alloy of at least two constituent materials. The spray material may include or consist essentially of at least one of (e.g., only one) of the constituent materials. Spray-depositing the spray material may include or consist essentially of cold spray. Welding the tiles together may include or consist essentially of melting at least one constituent material while at least one other constituent material remains unmelted. The constituent materials may include or consist essentially of Mo and Ti. The tiles may consist essentially of the sputtering material. Mechanical force may be applied to the interface with the first and second welding electrodes. At least a portion of each of the two tiles may be substantially planar (and the joined target may be substantially planar). At least a portion of each of the two tiles may be substantially tubular (and the joined target may be substantially tubular). After its formation, the joined sputtering target may be annealed at a temperature selected from the range of approximately 480° C. to approximately 1425° C., or at a temperature selected from the range of approximately 1100° C. to approximately 1425° C. The joined sputtering target may be disposed on a backing plate after formation of the joined sputtering target. The joined sputtering target may be heat treated at least proximate the interface. The interface may define a plane that is not perpendicular to the top and/or bottom surfaces of the tiles.

In another aspect, embodiments of the invention feature a joined sputtering target comprising a sputtering material that comprises an alloy or mixture of first and second constituent materials. The joined sputtering target includes or consists essentially of first and second discrete sputtering-target tiles joined at an interface therebetween, the first and second tiles each including or consisting essentially of the sputtering material. Across the interface, (i) regions of the first tile consisting essentially of the first constituent material are bonded to regions of the second tile consisting essentially of the first constituent material, (ii) regions of the first tile consisting essentially of the first constituent material are bonded to regions of the second tile consisting essentially of the second constituent material, (iii) regions of the first tile consisting essentially of the second constituent material are bonded to regions of the second tile consisting essentially of the first constituent material, and (iv) regions of the first tile consisting essentially of the second constituent material are not bonded to regions of the second tile consisting essentially of the second constituent material.

Embodiments of the invention may include one or more of the following in any of a variety of combinations. The bonded regions may be partially melted and/or partially interdiffused. The first constituent material may include or consist essentially of Ti and the second constituent material may include or consist essentially of Mo. The first and second tiles may each consist essentially of the sputtering material.

In a further aspect, embodiments of the invention feature a method of forming a joined sputtering target including or consisting essentially of a sputtering material. Two discrete sputtering-target tiles, which include or consist essentially of the sputtering material, are disposed proximate each other, thereby forming an interface between the tiles. The interface includes or consists essentially of an interlocking joint therein and/or a recess in a top surface thereof. A spray material is spray-deposited over at least a portion of the interface, thereby joining the tiles to form the joined sputtering target.

Embodiments of the invention may include one or more of the following in any of a variety of combinations. Disposing the two tiles proximate each other may include or consist essentially of disposing the two tiles substantially in contact with each other. At least a portion of each of the two tiles may be substantially planar (and the joined target may be substantially planar). At least a portion of each of the two tiles may be substantially tubular (and the joined target may be substantially tubular). The spray material may include or consist essentially of the sputtering material. The tiles may consist essentially of the sputtering material. The sputtering material may include or consist essentially of a mixture or alloy of at least two constituent materials. The constituent materials may include or consist essentially of Mo and Ti. The spray material may include or consist essentially of at least one of (e.g., only one) of the constituent materials. The interface may include a recess, and the spray deposition may fill at least a portion of the recess with the spray material. The interface may include a recess defined by a beveled surface (which may be reentrant) of at least one of the two tiles.

At least a portion of the beveled surface may be substantially planar and form an angle of greater than 45° with respect to the normal to the top surface of the joined sputtering target. The angle may be selected from the range of 45° to 60°. Spray material may be spray deposited at an angle approximately perpendicular to the beveled surface. Spray material may be spray deposited by (i) spray-depositing a first portion of the spray material at an angle approximately perpendicular to the beveled surface and (ii) thereafter, spray-depositing a second portion of the spray material at an angle approximately perpendicular to the top surface of the joined sputtering target. After its formation, the joined sputtering target may be annealed at a temperature selected from the range of approximately 480° C. to approximately 1425° C., or at a temperature selected from the range of approximately 1100° C. to approximately 1425° C. The interface may include an interlocking joint that includes or consists essentially of a tongue-in-groove joint, a dovetail joint, a rabbet joint, a finger joint, or a spline joint. An edge of at least one of the tiles may be beveled prior to disposing the tiles proximate each other, and the beveled edge(s) may form at least a portion of the recess. Spray-depositing the spray material may include or consist essentially of cold spray. The joined sputtering target may be sputtered, and the spray-deposited material may substantially prevent particle generation at the interface. The joined sputtering target may be disposed on a backing plate after spray deposition. The two tiles may be disposed proximate each other on a backing plate prior to spray deposition. The joined sputtering target may be heat treated at least proximate the spray material. The interface may define a plane that is not perpendicular to the top and/or bottom surfaces of the joined sputtering target.

In yet a further aspect, embodiments of the invention feature a joined sputtering target including or consisting essentially of a sputtering material. The joined sputtering target includes or consists essentially of two discrete sputtering-target tiles joined at an interface therebetween. The tiles include or consist essentially of the sputtering material. The interface includes a recess therealong at least partially filled with unmelted powder.

Embodiments of the invention may include one or more of the following in any of a variety of combinations. The two tiles may be joined at opposing edges, and the interface may include portions of the two opposing edges substantially in contact with each other and disposed beneath the at least partially filled recess. One of the two opposing edges may at least partially (or even completely) overlap the other opposing edge at the interface below the at least partially filled recess. The interface may define a plane that is not perpendicular to the top and/or bottom surfaces of the joined sputtering target. An interlocking joint that includes or consists essentially of portions of the two tiles may be present at the interface. The interlocking joint may include or consist essentially of a tongue-in-groove joint, a dovetail joint, a rabbet joint, a finger joint, or a spline joint. At least one of the tiles may include a beveled edge, and the beveled edge(s) may form at least a portion of the recess. The at least one beveled edge may have a reentrant surface. At least a portion of the at least one beveled edge may be substantially planar and form an angle of greater than 45° with respect to the normal to the top surface of the joined sputtering target. The angle may be selected from the range of 45° to 60°.

The unmelted powder may include or consist essentially of the sputtering material. The tiles may consist essentially of the sputtering material. The sputtering material may include or consist essentially of a mixture or an alloy of at least two constituent materials. The unmelted powder may include discrete regions each substantially free of at least one of the constituent materials. The joined sputtering target may include at least one region at the interface in which at least two of the constituent materials are interdiffused. The constituent materials may include or consist essentially of Mo and Ti. A backing plate may be attached to the tiles. The unmelted powder may be in contact with the backing plate. At least a portion of the joined sputtering target may be substantially planar. At least a portion of the joined sputtering target may be substantially tubular.

In another aspect, embodiments of the invention feature a joined sputtering target including or consisting essentially of a sputtering material. The joined sputtering target includes or consists essentially of two discrete sputtering-target tiles joined at an interface therebetween. The tiles include or consist essentially of the sputtering material. The interface includes a recess therealong at least partially filled with melted powder.

Embodiments of the invention may include one or more of the following in any of a variety of combinations. The two tiles may be joined at opposing edges, and the interface may include portions of the two opposing edges substantially in contact with each other and disposed beneath the at least partially filled recess. One of the two opposing edges may at least partially (or even completely) overlap the other opposing edge at the interface below the at least partially filled recess. The interface may define a plane that is not perpendicular to the top and/or bottom surfaces of the joined sputtering target. An interlocking joint that includes or consists essentially of portions of the two tiles may be present at the interface. The interlocking joint may include or consist essentially of a tongue-in-groove joint, a dovetail joint, a rabbet joint, a finger joint, or a spline joint. At least one of the tiles may include a beveled edge, and the beveled edge(s) may form at least a portion of the recess. The at least one beveled edge may have a reentrant surface. At least a portion of the at least one beveled edge may be substantially planar and form an angle of greater than 45° with respect to the normal to the top surface of the joined sputtering target. The angle may be selected from the range of 45° to 60°.

The melted powder may include or consist essentially of the sputtering material, and may have been deposited via thermal spray. The tiles may consist essentially of the sputtering material. The sputtering material may include or consist essentially of a mixture or an alloy of at least two constituent materials. The melted powder may include discrete regions each substantially free of at least one of the constituent materials. The joined sputtering target may include at least one region at the interface in which at least two of the constituent materials are interdiffused. The constituent materials may include or consist essentially of Mo and Ti. A backing plate may be attached to the tiles. The melted powder may be in contact with the backing plate. At least a portion of the joined sputtering target may be substantially planar. At least a portion of the joined sputtering target may be substantially tubular.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "cold spray" refers to techniques in which one or more powders are spray-deposited without melting during spraying, e.g., cold spray, kinetic spray, and the like. The sprayed powders may be heated prior to and during deposition, but only to temperatures below their melting points. As used herein, the terms "approximately" and "substantially" mean±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
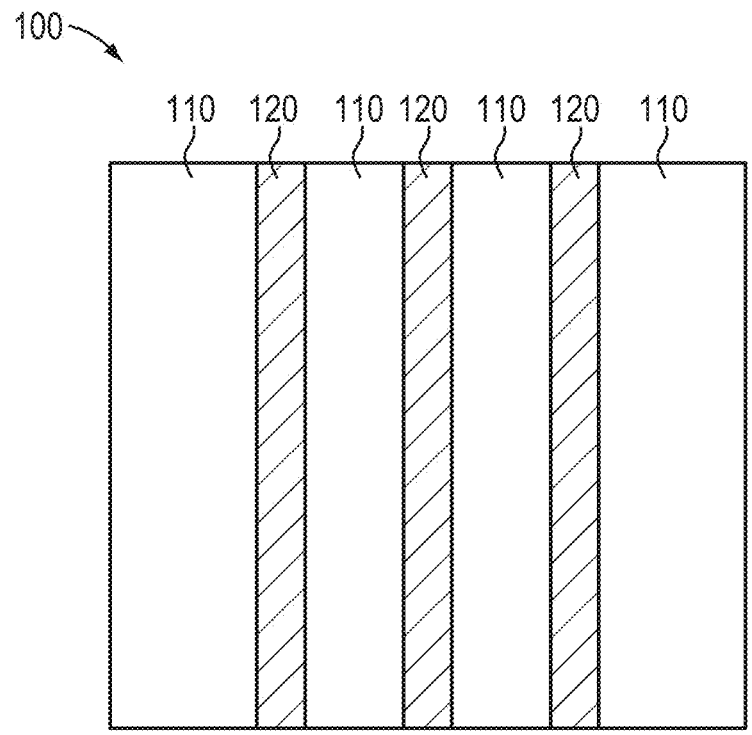
FIGS. 1A and 1B are schematic plan views of joined sputtering targets in accordance with various embodiments of the invention.
Figure 1B:
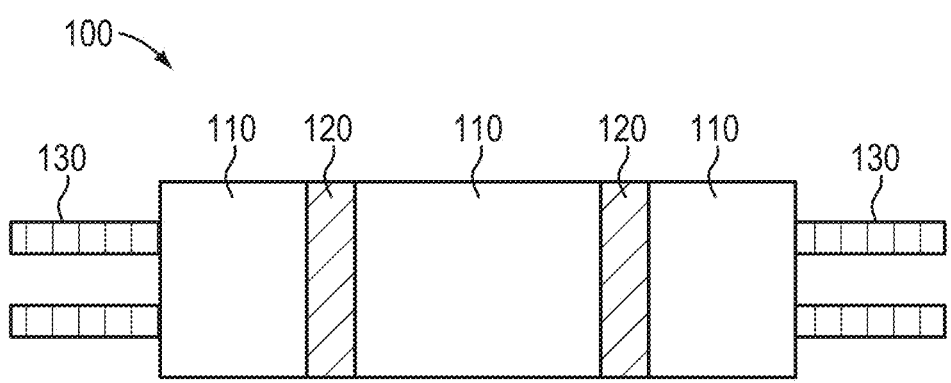

FIGS. 1A and 1B are schematic plan views of joined sputtering targets 100 formed by the joining of smaller sputtering-target tiles 110 in accordance with embodiments of the invention. As shown, the tiles 110 are joined via regions 120 that, at least in part, include or consist essentially of one or more spray materials formed by spray deposition (e.g., cold spray, thermal spray, plasma spray, etc.). As shown, the tiles may be substantially rectilinear (FIG. 1A) or tubular (FIG. 1B) and may be joined on one or two sides. In other embodiments the tiles have other shapes (e.g., square) and/or are joined on more than two sides. The tiles may each be of substantially the same size and/or shape, or two or more of the tiles may have different sizes and/or shapes. In various embodiments, regions of the tiles are substantially planar or tubular (e.g., in portions between the regions 120), and the joined target 100 may be substantially planar or tubular. A joined target 100 may be disposed on a backing plate (not visible in FIG. 1A) or backing tube 130 (portions of which are visible in FIG. 1B) either before or after formation of the joining regions 120. The backing plate or tube 130 may include or consist essentially of a metal such as Cu and/or Al, and may have a melting point below that of the material of tiles 110 and/or the material of regions 120, and may even have a melting point below the temperature that the sprayed material constituting regions 120 reaches during spray deposition (e.g., in cases where the backing plate or tube is attached to the joined target 100 after formation of regions 120). In some embodiments of the invention, particularly those in which the joined target is tubular, the backing plate or tube 130 may include or consist essentially of a metal such as stainless steel and/or Ti. The tiles 110 typically include or consist essentially of one or more metallic materials, e.g., Ti, Nb, Ta, W, Mo, other refractory metals, or composite materials (alloys or mixtures) such as Mo/Ti, W/Ti, Cu/W, etc. The regions 120 preferably include or consist essentially of at least one of the constituent materials of tiles 110. For example, the sprayed material in regions 120 may include or consist essentially of the same elemental metal as in tiles 110, one or more of the constituent metals of a composite tile 110 (e.g., a tile 110 may include or consist essentially of Mo/Ti, and the region 120 may include or consist essentially of Ti), or the same plurality of constituent metals of a composite tile 110, in the same concentration as in tile 110 or in a different mix of concentrations as in tile 110 (e.g., a tile 110 may include or consist essentially of 50% Mo and 50% Ti, and the region 120 may include or consist essentially of 40% Mo and 60% Ti). The tiles 110 and regions 120 preferably include or consist essentially of the same material(s) so that, when the joined target 100 is sputtered, the composition of the material sputtered from the target 100 is substantially constant across the dimensions of target 100 and as a function of sputtering time and/or lifetime (i.e., amount of utilization) of target 100.

Figure 2A:
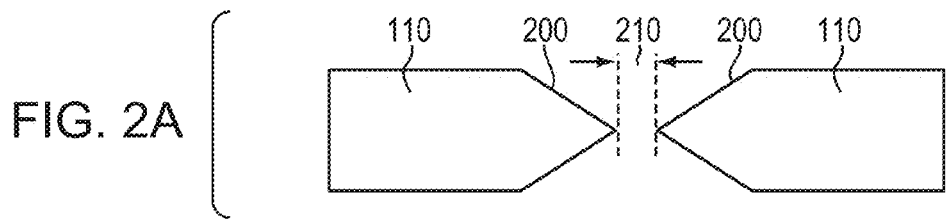
FIGS. 2A-2F are schematic cross-sections of two sputtering-target tiles being joined via utilization of a releasable rod and spray deposition in accordance with various embodiments of the invention.

FIGS. 2A-2F schematically depict, in cross-section, various steps of a process for forming a joined sputtering target in accordance with various embodiments of the present invention. FIGS. 2A-2F (and most subsequent figures) depict either substantially planar tiles 110 (i.e., utilized to fabricate a planar joined target 100) or to portions of substantially tubular tiles 110 (i.e., utilized to fabricate a tubular joined target 100), which appear planar in cross-section. (Specifically, the cross-section of a tubular tile 110 would include two substantially parallel regions, only one of which is shown for each tile 110 in FIGS. 2A-2F and many subsequent figures.) As shown in FIG. 2A, a bevel 200 is formed in at least one of the tiles 110, and the tiles 110 are positioned with a gap 210 at the interface between the tiles 110. The gap 210 may range from, e.g., approximately 2 mm to approximately 8 mm. As shown, bevels 200 are formed in both tiles 110, but in other embodiments a bevel (or chamfer) 200 is formed in only one of the tiles 110. While the bevels 200 in FIG. 2A are shown as having sloped and straight sidewalls, other embodiments of the invention feature bevels 200 having curved or even arbitrary sidewalls (and/or may be reentrant, as described in more detail below), and the bevels 200 may be asymmetric relative to the interface between the tiles 110 (i.e., any portion of the tiles 110 in close proximity or in contact). The bevels 200 may even be asymmetric relative to the horizontal axis (i.e., perpendicular to the interface between tiles 110) defined by the tiles 110 at approximately one-half of their thicknesses. Generally, the bevel(s) 200 may form any type of recess (i.e., a region depressed relative to the top surface and/or the bottom surface of at least one of the tiles 110 and at least partially defined by bevel(s) 200 of neighboring tiles 110) along an interface between tiles 110 that does not disturb close proximity or contact between at least a portion of the opposed faces of the tiles 110. As shown in FIG. 2A, the bevels 200 may define recesses relative to both the top and bottom surfaces of tiles 110. While FIG. 2A depicts the tiles 110 as being entirely separated by gap 210, portions of the tiles 110 may be in physical contact, and irregularities along the edge of at least one of the tiles 110 may at least partially define the gap 210. In various embodiments, substantially all of a sidewall of at least one of the tiles 110 may be beveled (i.e., cut at a non-right angle to the top and/or bottom surface of the tile), and the two tiles 110 may be placed in close proximity but not in contact prior to joining via spray deposition (as detailed below). In such embodiments the bevel(s) 200 increase the volume of the area to be at least partially filled by spray deposition and/or the surface area of contact between the sprayed material and the tiles 110.

Figure 2B:
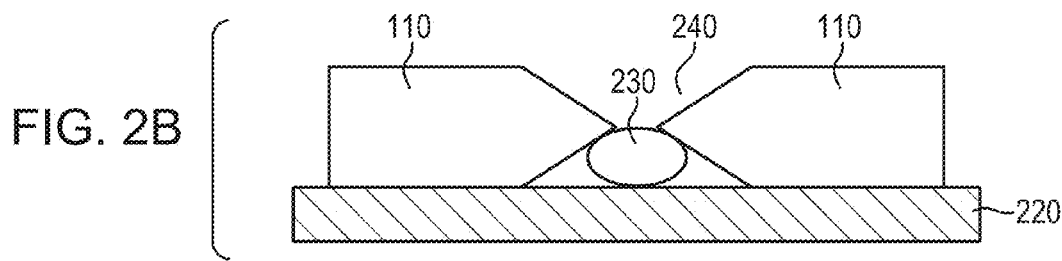
Figure 2C:
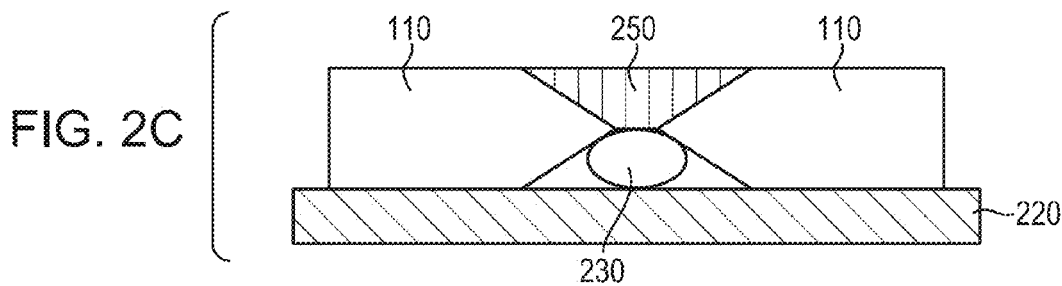

As shown in FIG. 2B, the tiles 110 may be positioned on a support fixture 220, which may include or consist essentially of any suitably rigid material (e.g., metal, ceramic, or even wood) and that is preferably substantially planar. (For tubular tiles 110, the fixture 220 may be cylindrical or tubular and disposed within the annular space defined by the tiles 110.) Additionally, at least a portion of the gap 210 (e.g., along its length perpendicular to the plane of the page of FIGS. 2A-2F) is substantially filed with a gap-fill material such as a rod 230. The rod 230 may have a cross-section that is substantially circular or elliptical, as shown in FIG. 2B, or it may have any other cross-sectional shape suitable for filling at least a portion of the gap 210. Rod 230 may be substantially solid or hollow, and it preferably includes or consists essentially of the material of tiles 110 or material subsequently sprayed thereon (as detailed below), or at least one constituent material of tiles 110 or such sprayed material. Such compositional matching may reduce or substantially eliminate any contamination due to rod 230 from the final joined target, as the rod 230 is typically substantially or completely removed during the process detailed below. As shown in FIG. 2B, a recess 240 may be at least partially defined by the bevels in tiles 110 and a portion of the gap-fill material (here rod 230). The rod 230 may have a diameter or edge length ranging, e.g., from approximately 3 mm to approximately 9 mm. The diameter or edge length of the rod 230 may preferably be less than one-half of the thickness of the tiles 110 being joined. In some embodiments, the rod 230 is deformable to substantially "seal" the gap 210 and thereby substantially prevent the flow of powder particles during subsequent spray deposition (as detailed below).

After rod 230 has been positioned to fill at least a portion of the gap 210, a material 250 is spray-deposited thereover to partially or substantially fill the recess 240. The sprayed material 250 is preferably deposited by cold spray, and thus includes or consists essentially of substantially unmelted powder, but in particular instances may instead be deposited by other spray-deposition methods such as plasma spray or other thermal spray techniques (and thus sprayed material 250 may include or consist essentially of substantially melted powder). The volume of spray-deposited material 250 present within the recess 240 typically forms a partial joint joining the two tiles 110. The amount of material 250 at the partial joint, enabled by the recess 240 at least partially formed by the bevel(s) 200, contributes to the strength of the joint and thus of the entire joined sputtering target after completion. The material 250 preferably includes or consists essentially of the material of tiles 110, or at least one constituent material of tiles 110 (for tiles 110 that are composites of multiple constituent materials), as described above in relation to FIGS. 1A and 1B.

Figure 2D:
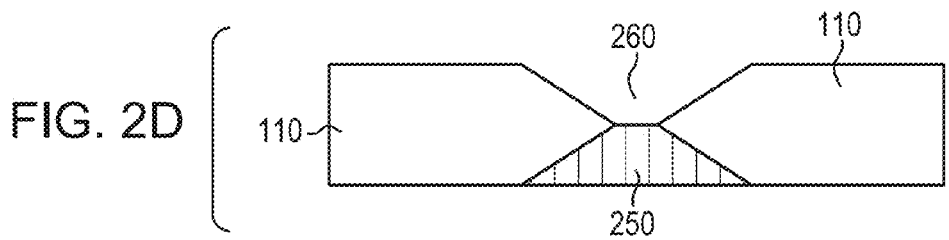
Figure 2E:
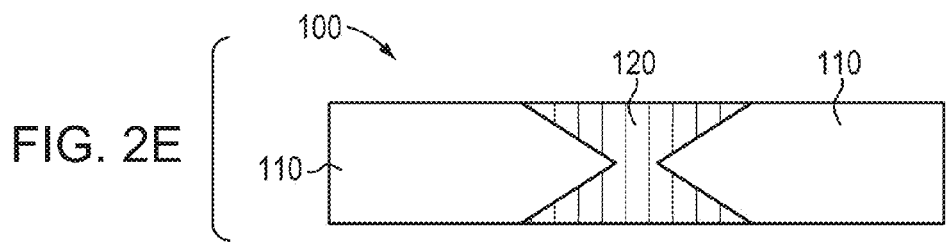
Figure 2F:
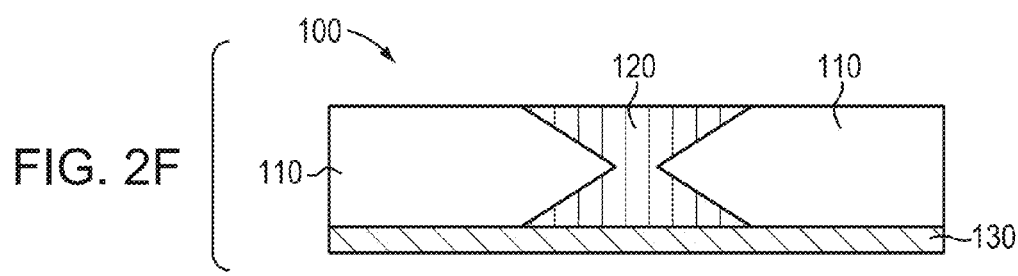

After spray-deposition of the material 250 to form the partial joint between the tiles 110, the rod 230 is removed from the tiles 110 and the material 250 by, e.g., mechanical force, grinding, and/or dissolution in an acidic agent. Preferably the entire rod 230 is removed, even if small portions of the material 250 and/or the tiles 110 are removed along with rod 230. As shown in FIG. 2D, the tiles 110 may then be flipped over and may be positioned on fixture 220 (not shown) or another suitable fixture for mechanical support. As shown in FIG. 2E, a recess 260 at least partially defined by the bevels 200 and the material 250 is subsequently filled (at least partially), preferably with the same material as material 250, to form the region (or "joint") 120 joining the tiles 110. As shown, the sprayed material may be deposited to be substantially coplanar with the surfaces of the joined tiles 110, thus providing the joined target 100 with one or more surfaces that are substantially planar. As also shown, at least a portion of the joint 120 may consist essentially of the sprayed material through its entire thickness; as described in more detail below, such a configuration may result in a mechanically stronger joint 120. As shown in FIG. 2F, the tiles 110 (or effectively, the joined target 100) may be attached to a backing plate 130 either before or after the sprayed material is deposited within the recess 160 to complete the joint 120.

After formation of the joint 120, the joined target 100 (at least proximate the joint 120) may be heat treated for stress relief (e.g., to improve ductility) and/or to provide the joint 120 with a microstructure substantially equal to that of the joined tiles 110. For example, for tiles 110 including or consisting essentially of a mixture of multiple constituents, the microstructure of the tiles 110 may include interdiffused regions between regions corresponding to different constituents (as described in more detail below with reference to FIGS. 8A and 8B; for example, arising from a HIP process for forming the tiles 110). After a heat treatment, the joint 120 may feature such interdiffused regions, which may have approximately the same size of such regions in the tiles 110 prior to joining. In some embodiments of the invention, the heat treatment may be performed under vacuum, at a temperature between approximately 700° C. and approximately 900° C., and for a time between approximately 1 hour and approximately 16 hours.

In addition, the heat treatment may relieve residual stresses from the spray-deposition process. For example, in many cases, sprayed material melted during spraying tends to have tensile residual stress, while sprayed material that is not melted during spraying tends to have compressive residual stress. (For example, cold-sprayed Ta may have residual compressive stress of between 30 and 50,000 psi.) Such residual stresses may result in non-uniform sputtering rates from the target incorporating the sprayed material. In conventional (i.e., not incorporating sprayed material) targets, residual machining stresses frequently necessitate a costly burn-in period (i.e., sputtering away of the stressed surface layer) prior to sputtering with new targets. Embodiments of the present invention described herein facilitate the manufacture of joined sputtering targets and subsequent heat treatment prior to the target being joined to a backing plate. (The backing plate and the joining compound, e.g., In solder, typically have lower melting points and thus may not be able to withstand a heat treatment adequate to reduce or substantially eliminate residual stress from the target.) In this manner, the need for a burn-in period prior to sputtering from the joined target is reduced or substantially eliminated.

FIGS. 3A-3F depict another process for forming a joined sputtering target 100 utilizing a gap-fill material between sputtering-target tiles 110 in accordance with embodiments of the present invention. As described above in relation to FIG. 2A, the tiles 100 have one or more bevels 200 and are positioned with gap 210 at the interface between the tiles 110 (which may result, as discussed above, from portions of the tiles 110 being in contact or close proximity at the interface).

Figure 3A:
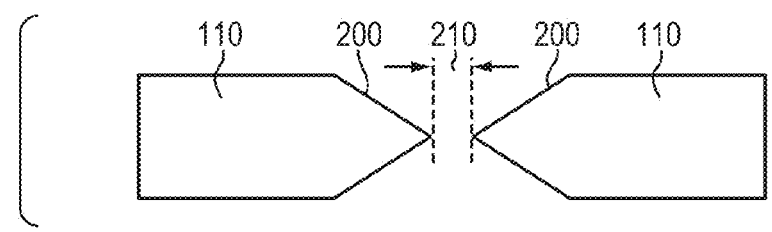
FIGS. 3A-3F are schematic cross-sections of two sputtering-target tiles being joined via utilization of a gap-filling weld bead and spray deposition in accordance with various embodiments of the invention.
Figure 3B:
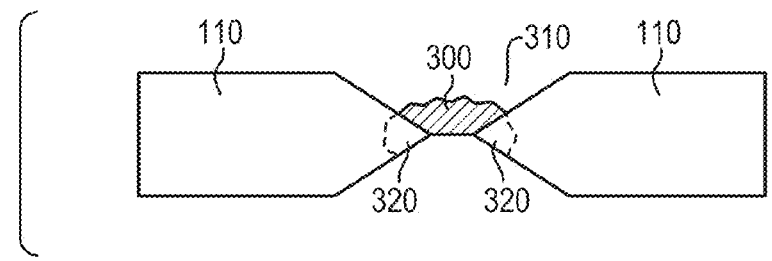

As shown in FIG. 3B, in various embodiments of the invention, at least a portion of the gap 210 is subsequently filled with a gap-fill material that includes or consists essentially of a weld bead 300 disposed in a recess 310 at least partially defined by the bevels 200. The weld bead 300 may be formed by, e.g., tungsten inert gas (TIG) welding (utilizing an inert cover gas such as helium or argon), and may be formed with or without the use of a filler wire or rod (which preferably includes or consists essentially of the material of tiles 110 or at least one constituent material thereof). The weld bead 300 thus includes or consists essentially of portions of the tiles 110 and/or the filler material. The weld bead 300 may be a substantially continuous bead along the entire interface between the tiles 110 or may be a series of spot welds along the interface. In preferred embodiments in which material is subsequently deposited by cold spray (as detailed below), the weld bead 300 is a substantially continuous bead along the entire interface between the tiles 110 that substantially seals the gap 210. As shown in FIG. 3B, formation of the weld bead 300 may alter the microstructure of one or both tiles 110 near the weld bead 300 (due to, e.g., the elevated welding temperature), forming altered regions 320. Region 320 typically includes or consists essentially of a heat-affected zone (HAZ), which may be characterized by substantial grain growth compared to regions of the tiles 110 outside of the HAZ. The grain growth may result in the sweeping of impurities to the grain boundaries and significant embrittlement of the HAZ for materials such as Mo and its alloys. Additionally, for composite materials such as MoTi, the HAZ may feature increased porosity (compared to regions of the tiles 110 outside of the HAZ) due to gas evolution due to local melting of one or more of the constituent materials (e.g., melting of Ti but not of Mo).

Figure 3C:
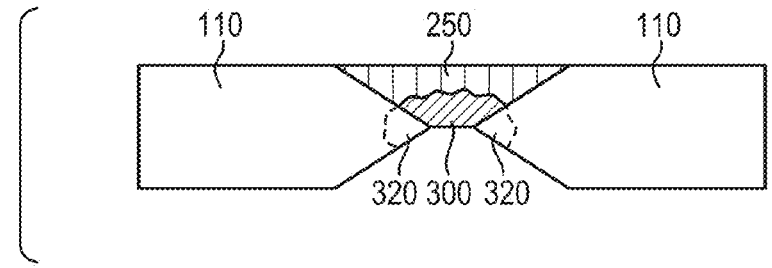
Figure 3D:
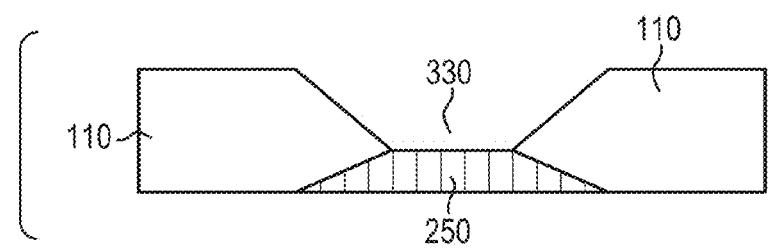
Figure 3E:
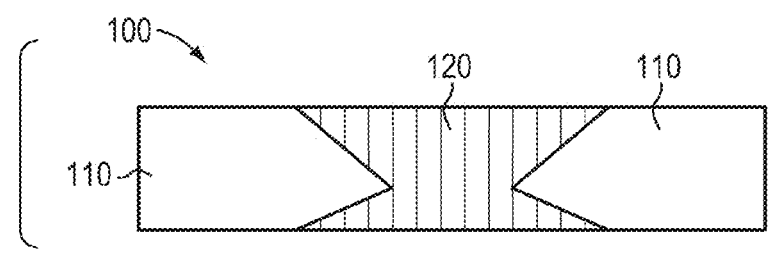
Figure 3F:
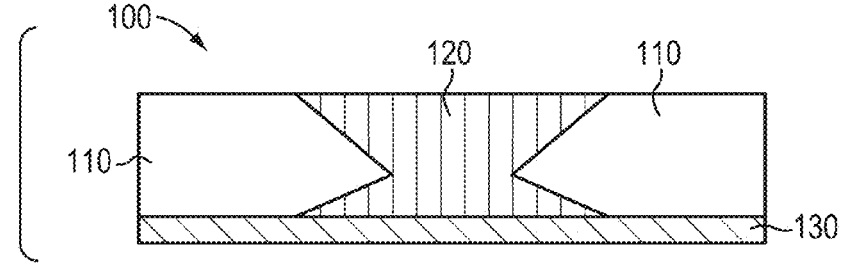

After formation of the weld bead 300, the remainder of recess 310 is partially or substantially filled via spray-deposition of the material 250, as shown in FIG. 3C. Afterwards, because the weld bead 300 typically has a different microstructure that that of the bulk of the tiles 110, the weld bead 300 is removed from the tiles 110 and the material 250, as shown in FIG. 3D. The removal may be performed by, e.g., mechanical grinding and/or chemical (e.g., acid) treatment. As shown, regions 320 are preferably also removed along with the weld bead 300, forming a recess 330 (defined at least in part by bevels 200 and the surfaces of tiles 110 revealed during removal of weld bead 300 and/or regions 320) shown in FIG. 3D. Such removal may also remove portions of the original material 250 deposited in recess 310 and/or additional portions of the tiles 110. Additional material 250 is subsequently spray-deposited within the recess 330 to complete formation of the joint 120, as shown in FIG. 3E. As shown, the sprayed material may be deposited to be substantially coplanar with the surfaces of the joined tiles 110, thus providing the joined target 100 with one or more surfaces that are substantially planar. As also shown, at least a portion of the joint 120 may consist essentially of the sprayed material through its entire thickness; as described in more detail below, such a configuration may result in a mechanically stronger joint 120. As shown in FIG. 3F, the tiles 110 (or effectively, the joined target 100) may be attached to a backing plate 130 either before or after the sprayed material is deposited within the recess 330 to complete the joint 120. After formation of the joint 120, the joined target 100 (at least proximate the joint 120) may be heat treated, for example as described above with reference to FIGS. 2A-2F.

Figure 4A:
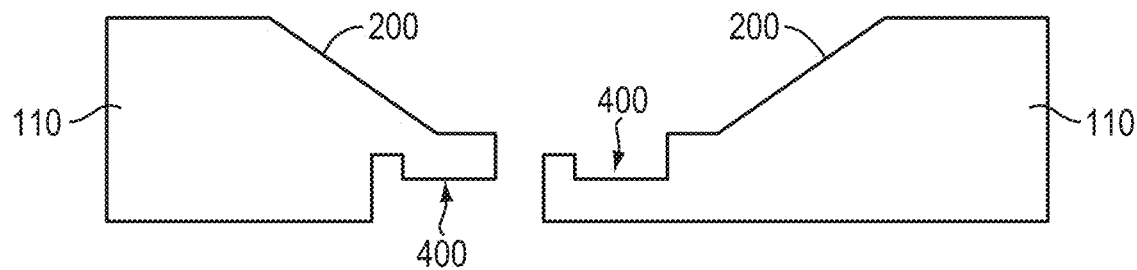
FIGS. 4A-4E are schematic cross-sections of two interlocking sputtering-target tiles being joined via welding and spray deposition in accordance with various embodiments of the invention.
Figure 4B:
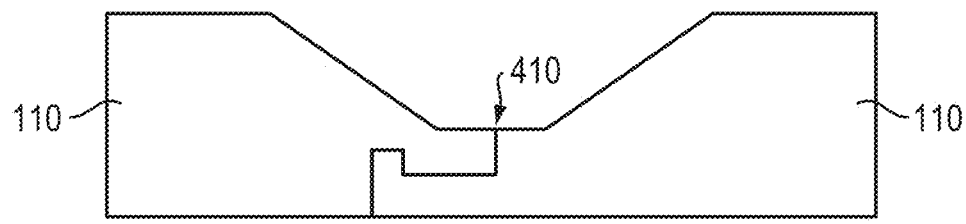

FIGS. 4A-4E depict a process for forming a joined sputtering target 100 utilizing sprayed material and an interlocking joint between sputtering-target tiles 110 in accordance with embodiments of the present invention. Specifically, the tiles 110 may be machined with complementary and/or interlocking features 400 that facilitate the joining of the tiles 110 and improve the strength of the joint 120 after spray deposition. As shown in FIG. 4B, the interlocking features 400 are joined to form a mechanical joint 410 (that may be, as detailed below, supplemented with spray-deposited material). While FIGS. 4A-4E depict a tongue-in-groove joint, other joints (including, e.g., dovetail joints, rabbet joints, finger joints, spline joints, etc.) may be utilized in conjunction with or instead of a tongue-in-groove joint. Furthermore, joined sputtering targets 100 may utilize different types of joints 410 to join different pairs of tiles 110. Generally, the interface between two tiles 110 may have one or more bevels 200, an interlocking feature (or "interlock") 400, or both. The interlock 400 may have any geometry that varies the contact interface from a straight interface in order to increase the contact surface area and/or provide mechanical linkage between the tiles 110. Before the tiles 110 are physically joined (i.e., before they are placed in direct contact with each other) to form mechanical joint 410, one or more portions of the surfaces that will meet in the locking joint 410 may be coated with a spray-deposited coating. The coating may be sprayed on all or portions of such surfaces on only one of the tiles 110 or on both of them. Thus, in accordance with various embodiments, two discrete sputtering-target tiles 100 including or consisting essentially of the sputtering material are disposed proximate each other, thereby forming an interface between the tiles that contains an interlocking joint 410.

Figure 4C:
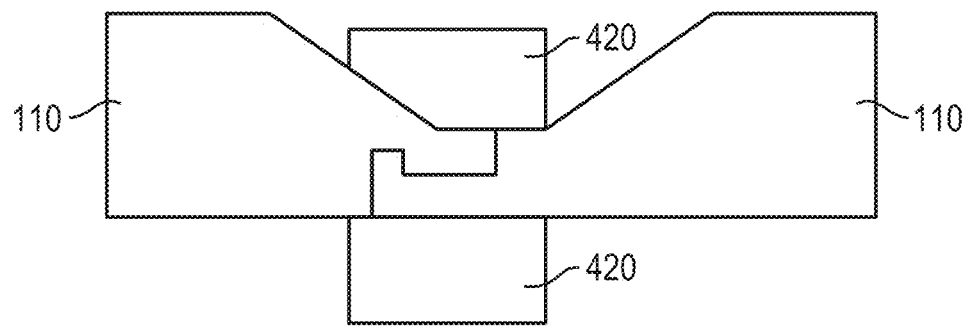

As shown in FIG. 4C, the mechanical joint 410 may preferably be strengthened and/or sealed together via use of welding, e.g., resistance seam welding. As shown, electrodes 420 are disposed on either side of mechanical joint 410 and, depending on the length of the joint 410 (i.e., out of the plane of the page), translated laterally along the joint 410. Mechanical force is generally applied to the mechanical joint 410 by the electrodes 420, and a large current is applied between the two electrodes 420. The heat resulting from the electrical resistance of the joint 410 welds the interlocks 400 together to strengthen the joint 410. Depending on the materials of tiles 110, a portion thereof within the joint 410 may even melt during the welding process. For example, for tiles 110 that include multiple constituent materials, one or more of the lower-melting-point constituents may melt during the welding to strengthen the joint 410 while one or more other constituents (i.e., having higher melting points) may remain substantially unmelted during the welding. In a specific example, for tiles 110 formed of Mo/Ti, the Ti may melt during the welding while the Mo phase remains unmelted. In preferred embodiments of the present invention, such melting is limited, and most of the bonding between the tiles 110 occurs due to solid-state diffusion between the tiles 110.

Figure 4D:
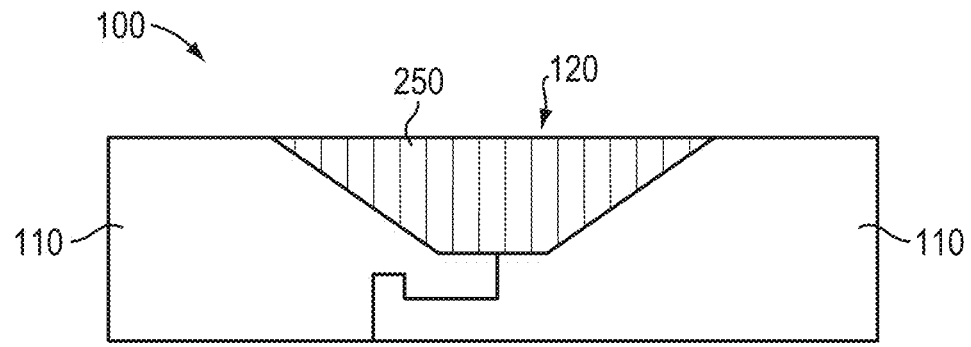
Figure 4E:
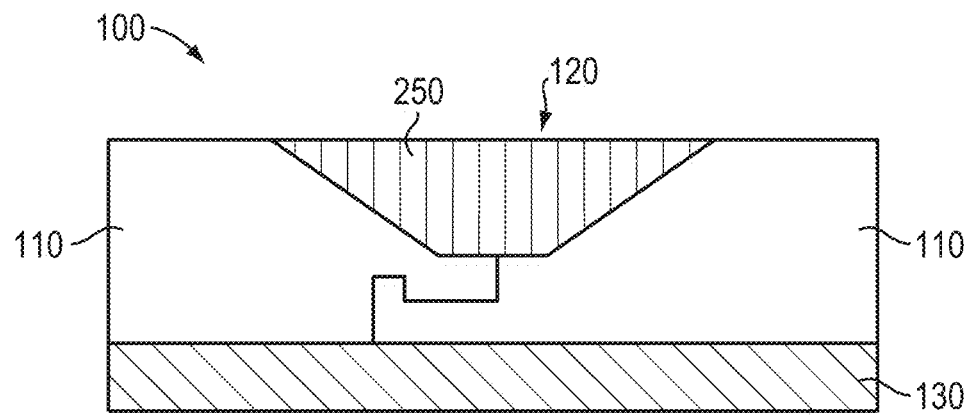

As shown in FIG. 4D, the mechanical joint 410 between the tiles 110 may be subsequently supplemented with a layer of spray-deposited material 250 to form joint 120 (which includes or consists essentially of the mechanical joint 410 and the layer of sprayed material 250). The tongue-in-groove joint (or alternative joint, as detailed above) may help prevent the propagation of defects through the subsequently sprayed layer of material 250. For example, a simple butt joint between the two tiles to be joined may result in a small gap or other discontinuity between the tiles at some point along the interface therebetween, and such a gap may propagate through the subsequently sprayed layer, weakening the sprayed joint and the final joined target. Accordingly, the tiles are desirably substantially in contact along the interface; by "substantially in contact" is meant that the interface is sufficiently free of gaps or discontinuities to avoid their perceptible or performance-affecting propagation through the sprayed layer of material 250. The welding described above with respect to FIG. 4C may be repeated after deposition of material 250, for example to enhance adhesion between the sprayed material 250 and the tiles 110. As shown in FIG. 4E, the tiles 110 (or effectively, the joined target 100) may be attached to a backing plate 130 either before or after the sprayed material 250 is deposited to complete the joint 120. After formation of the joint 120, the joined target 100 (at least proximate the joint 120) may be heat treated, for example as described above with reference to FIGS. 2A-2F.

Figure 5A:
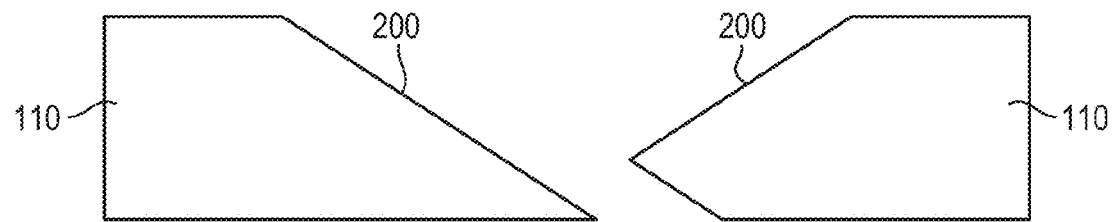
FIGS. 5A-5E are schematic cross-sections of two overlapping sputtering-target tiles being joined via welding and spray deposition in accordance with various embodiments of the invention.
Figure 5B:
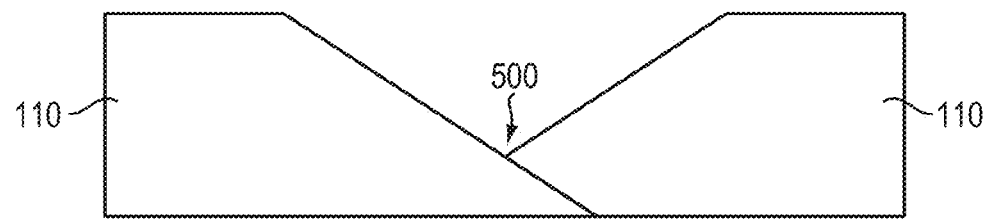

FIGS. 5A-5E depict a process for forming a joined sputtering target 100 similar to that depicted in FIGS. 4A-4E but utilizing overlapping sputtering-target tiles 110 in accordance with embodiments of the present invention. Specifically, the bevels 200 of tiles 110 may be machined such that a portion of one tile 110 overlaps a portion of the other tile 110 when the tiles are brought into proximity or substantial contact. This overlap feature, similar to mechanical joint 410 described above, facilitates the joining of the tiles 110 and improves the strength of the joint 120 after spray deposition. As shown in FIG. 5B, the tiles 110 are brought into close proximity or substantial contact, forming an overlapping region 500 (that may be, as detailed below, supplemented with spray-deposited material). Joined sputtering targets 100 may utilize different types of overlapping regions 500 between different pairs of tiles 110. Before the tiles 110 are placed in direct contact with each other to form overlapping region 500, one or more portions of the surfaces that will meet in the overlapping region 500 may be coated with a spray-deposited coating. The coating may be sprayed on all or portions of such surfaces on only one of the tiles 110 or on both of them.

Figure 5C:
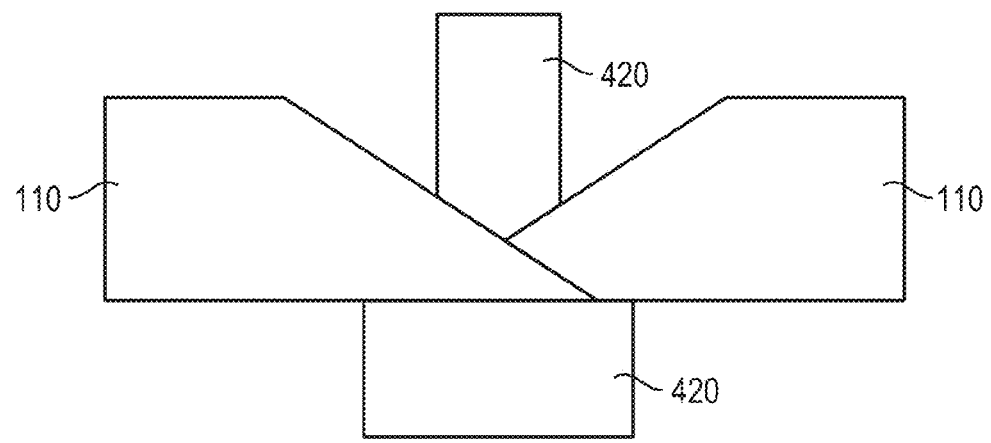

As shown in FIG. 5C, the overlapping region 500 may preferably be strengthened and/or sealed together via use of welding, e.g., resistance seam welding. As shown, electrodes 420 are disposed on either side of overlapping region 500 and, depending on the length of the overlapping region 500 (i.e., out of the plane of the page), translated laterally along the overlapping region 500. Mechanical force is generally applied to the overlapping region 500 by the electrodes 420, and a large current is applied between the two electrodes 420. The heat resulting from the electrical resistance of the overlapping region 500 welds tiles 110 together to strengthen the overlapping region 500. Depending on the materials of tiles 110, a portion thereof within the overlapping region 500 may even melt during the welding process. For example, for tiles 110 that include multiple constituent materials, one or more of the lower-melting-point constituents may melt during the welding to strengthen the overlapping region 500 while one or more other constituents (i.e., having higher melting points) may remain substantially unmelted during the welding. In a specific example, for tiles 110 formed of Mo/Ti, the Ti may melt during the welding while the Mo phase remains unmelted.

Figure 5D:
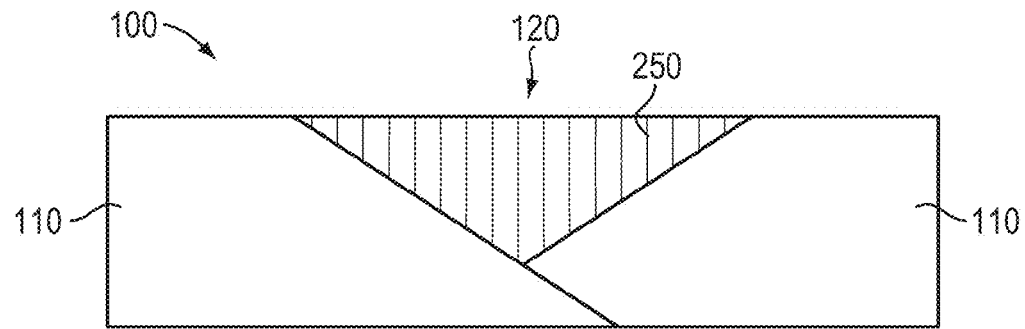
Figure 5E:
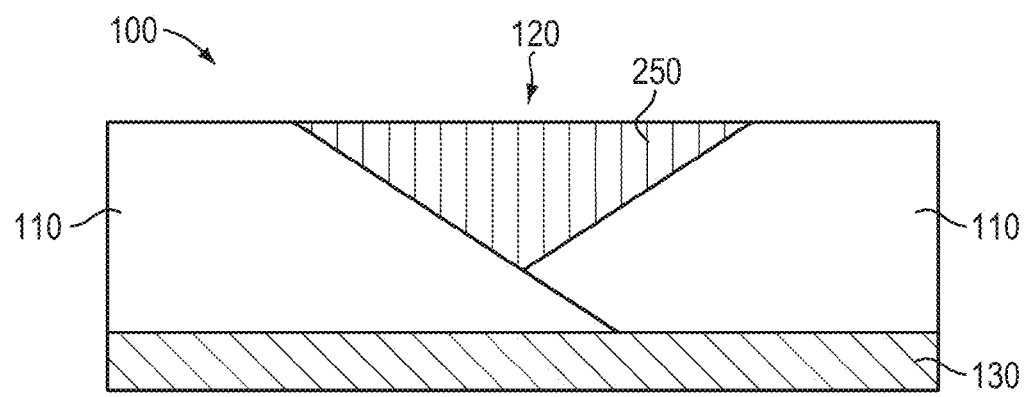

As shown in FIG. 5D, the overlapping region 500 between the tiles 110 may be subsequently supplemented with a layer of spray-deposited material 250 to form joint 120 (which includes or consists essentially of the overlapping region 500 and the layer of sprayed material 250). The overlapping region 500 (where the tiles 110 are substantially in contact) may help prevent the propagation of defects through the subsequently sprayed layer of material 250, as it may eliminate small gaps or discontinuities between the tiles 110 that may propagate through the subsequently sprayed layer, weakening the sprayed joint and the final joined target 100. As shown in FIG. 5E, the tiles 110 (or effectively, the joined target 100) may be attached to a backing plate 130 either before or after the sprayed material 250 is deposited to complete the joint 120. After formation of the joint 120, the joined target 100 (at least proximate the joint 120) may be heat treated, for example as described above with reference to FIGS. 2A-2F.

Figure 6A:
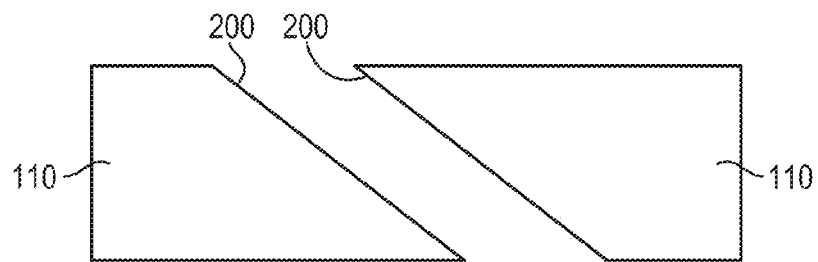
FIGS. 6A-6D are schematic cross-sections of two sputtering-target tiles being joined via welding in accordance with various embodiments of the invention.
Figure 6B:
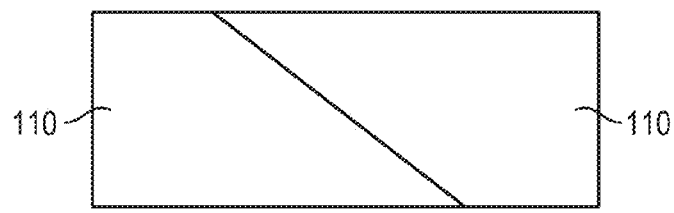

In some embodiments of the present invention, particularly those utilizing thinner sputtering-target tiles 110, the tiles 110 may be joined to form a joined target 100 utilizing welding (e.g., resistance seam welding) without material spray-deposited over the resulting welded joint. As shown in FIG. 6A, the tiles 110 may be provided with complementary bevels 200 such that, as shown in FIG. 6B, the tiles 110 may be fit together substantially gaplessly (and preferably without recesses on the top and bottom surfaces on the resulting joined tile). Before the tiles 110 are placed in direct contact with each other, one or more portions of the bevels 200 may be coated with a spray-deposited coating (e.g., including or consisting essentially of one or more, or even all, of the constituent materials of tiles 110, or even of the same material as that of tiles 110). The coating may be sprayed on all or portions of bevels 200 on only one of the tiles 110 or on both of them.

Figure 6C:
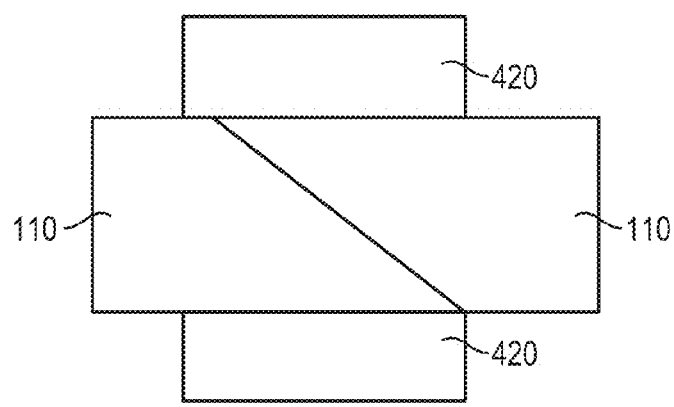
Figure 6D:
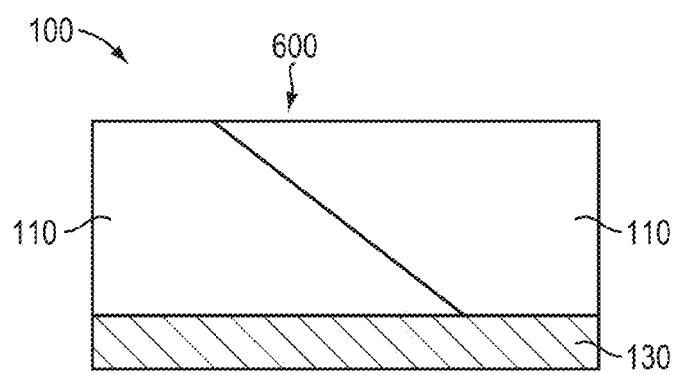

As shown in FIG. 6C, the interface between the tiles 110 is then strengthened and/or sealed together via use of welding, e.g., resistance seam welding. As shown, electrodes 420 are disposed on either side of the interface and, depending on the length of the interface (i.e., out of the plane of the page), translated laterally along the interface. Mechanical force is generally applied to the interface by the electrodes 420, and a large current is applied between the two electrodes 420. The heat resulting from the electrical resistance of the tiles 110 welds tiles 110 together to strengthen the bond between the tiles 110. Depending on the materials of tiles 110, a portion thereof may even melt during the welding process. For example, for tiles 110 that include multiple constituent materials, one or more of the lower-melting-point constituents may melt during the welding to strengthen the joint while one or more other constituents (i.e., having higher melting points) may remain substantially unmelted during the welding. In a specific example, for tiles 110 formed of Mo/Ti, the Ti may melt during the welding while the Mo phase remains unmelted. As shown in FIG. 6D, the tiles 110 (or effectively, the joined target 100) may be attached to a backing plate 130 after the welding process that forms joint 600. After formation of the joint 600, the joined target 100 (at least proximate the joint 600) may be heat treated, for example as described above with reference to FIGS. 2A-2F.

Figure 6E:
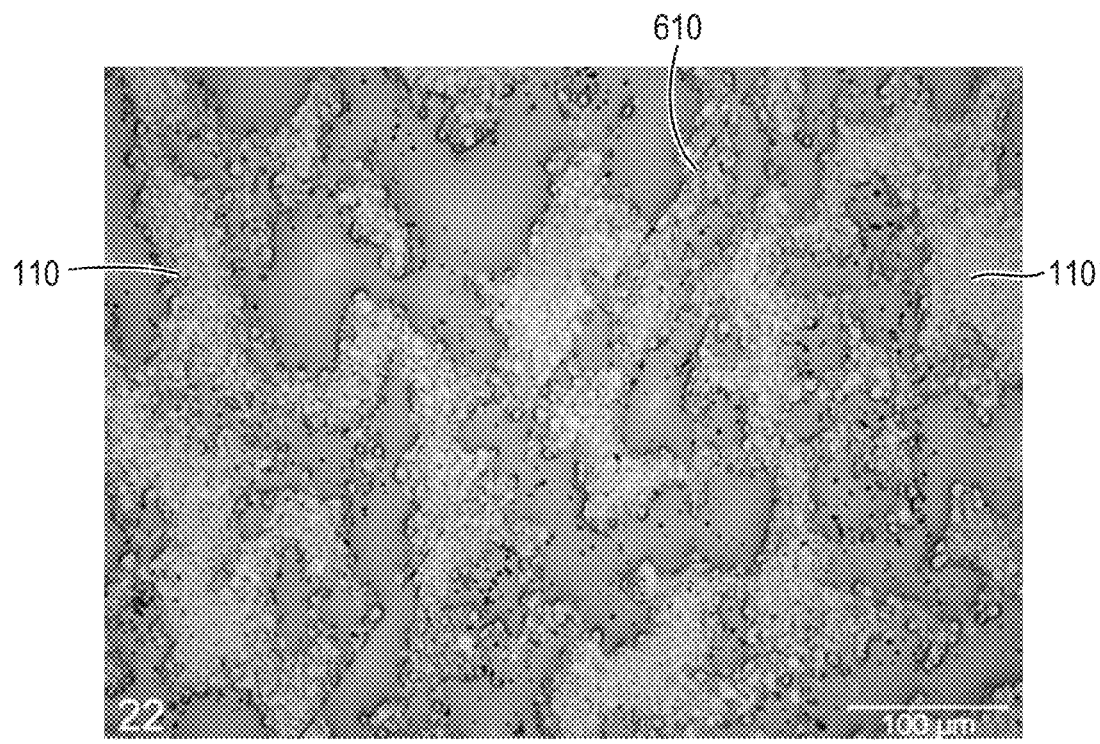
FIGS. 6E and 6F are cross-sectional micrographs of sputtering target tiles joined in accordance with various embodiments of the invention.

In some embodiments of the present invention, the above-described welding technique joins composite tiles 110 together via preferential bonding (via, e.g., at least partial melting and/or solid-state diffusion) of only one of (or less than all of) the constituents of the tiles, e.g., the constituent(s) having lower individual melting point(s). FIG. 6E is a micrograph of two Mo/Ti composite tiles joined in such a manner, in which preferential bonding was achieved via adjustment of the power density utilized in the welding process. As shown, Ti regions in the two tiles 110 are preferentially bonded to other Ti regions and to Mo regions across a bonding interface 610, but Mo regions of the two tiles 110 that abut at interface 610 have not bonded (at least not completely). The tiles 110 shown in FIG. 6E were approximately 9 mm thick, and the resulting bonding was successful across the full thickness. Closure pressure of the welding electrodes was approximately 55 MPa and the weld current density was 50 kA/m². Tiles 110 having larger thicknesses (e.g., up to 20 mm, or even thicker) may be joined with the techniques described herein by, e.g., increasing the weld pressure and/or the weld power density. The welding may be performed at speeds of, e.g., 10-16 cm/min, or even faster.

Figure 6F:
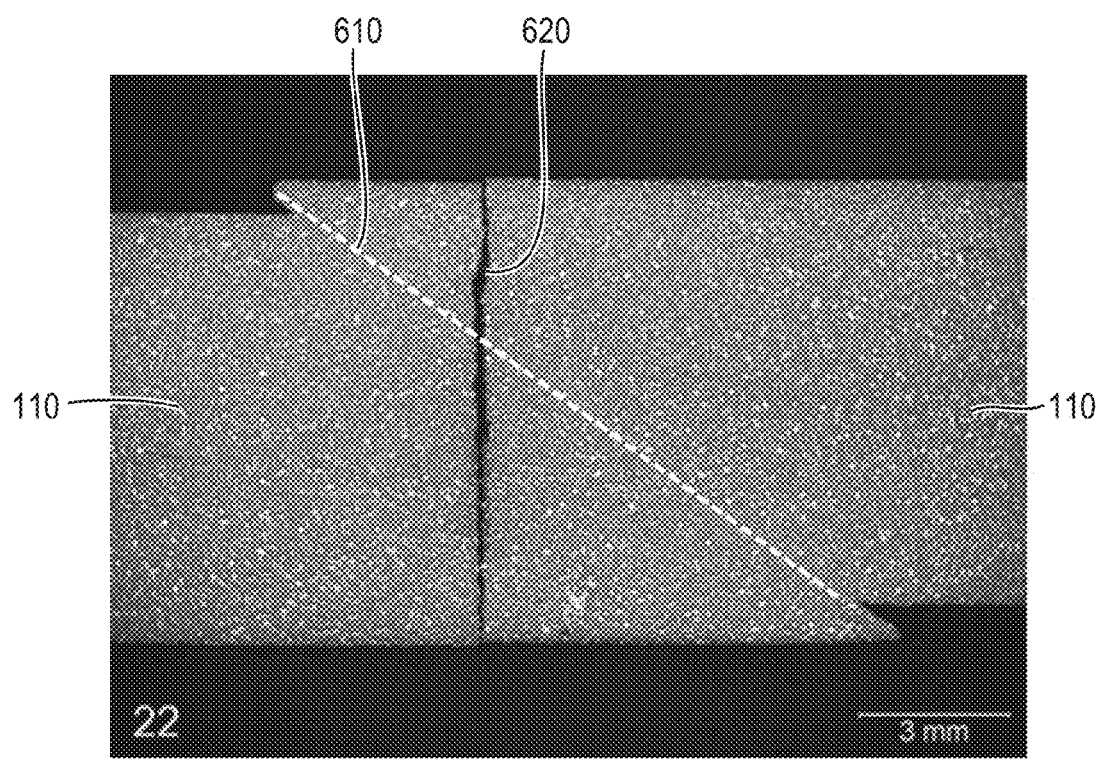

As shown in FIG. 6E, the two tiles 110 have been bonded together while retaining the microstructure of the tiles 110 in the vicinity of the bonding interface 610 without formation of a HAZ and without the above-described concomitant properties of a HAZ. Moreover, tiles 110 joined via this technique have sufficient bonding strength at interface 610 such that the interface 610 is not a failure point when stress is applied to the joined target. FIG. 6F depicts a joined sputtering target fabricated via seam welding of two tiles 110 after tensile stress testing to fracture. As shown, the fracture 620 does not correspond to or follow the bonding interface 610 (shown schematically by the dashed line). In addition, as in FIG. 6E, the microstructure along the interface 610 is substantially identical to that of the two tiles 110 away from interface 610, demonstrating that the joining process does not disrupt the microstructure of the tiles 110.

Figure 7A:
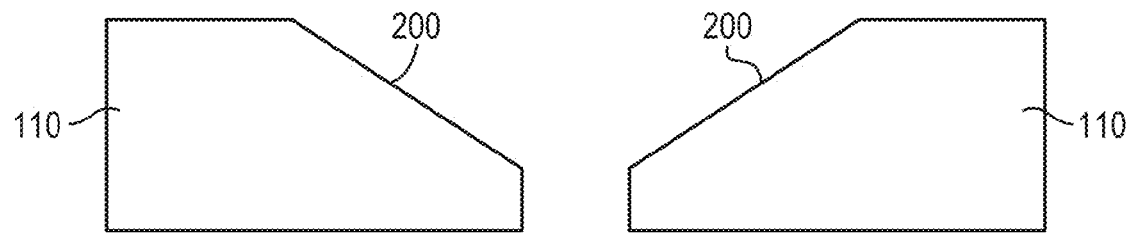
FIGS. 7A-7C are schematic cross-sections of two abutting sputtering-target tiles being joined via spray deposition in accordance with various embodiments of the invention.
Figure 7B:
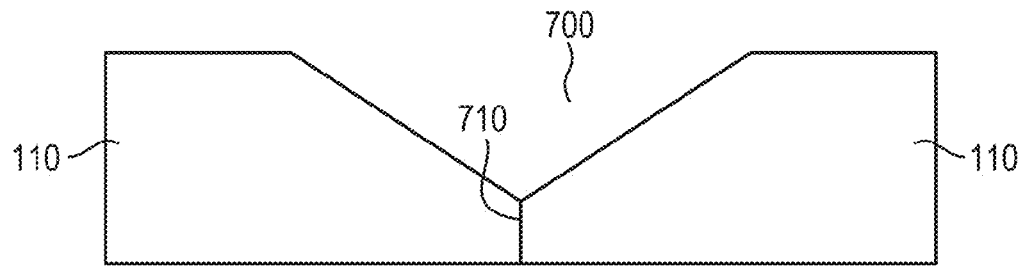
Figure 7C:
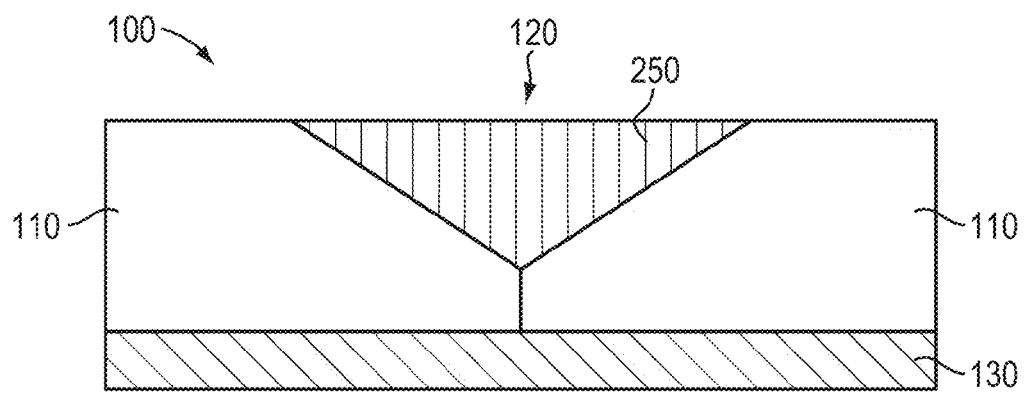
Figure 7D:
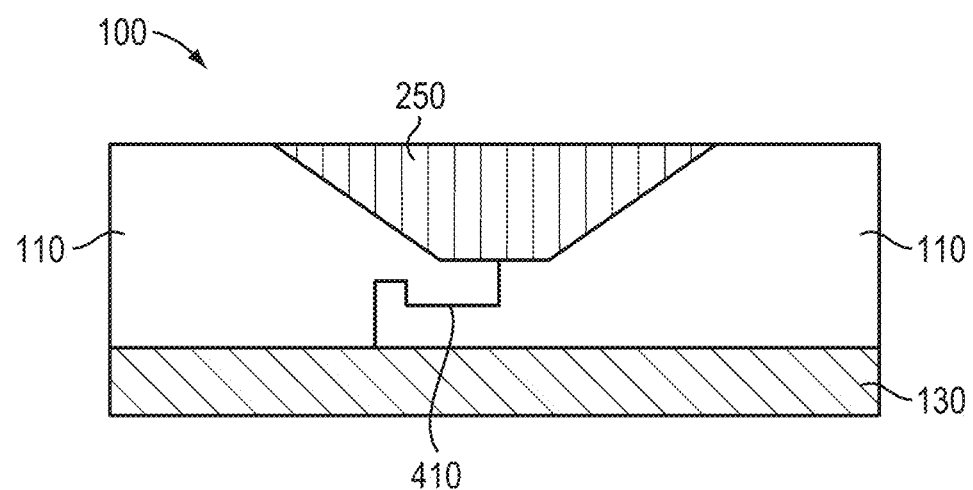
FIG. 7D is a schematic cross-section of a joined sputtering target formed of two interlocking sputtering-target tiles joined by the interlocking joint and by spray deposition in accordance with various embodiments of the invention.

FIGS. 7A-7D illustrate another embodiment of the present invention in which sputtering-target tiles 110 are brought into substantial contact and a joint 120 between the tiles 110 is formed via spray deposition. As shown, one or both of the tiles 110 has a bevel 200 that, when the tiles 110 are brought into substantial contact, defines a recess 700 above the interface 710 between the tiles 110. As shown in FIG. 7D, the interface 710 may include or consist essentially of a mechanical joint 410 (as described above) rather than a butt joint between the tiles 110. The interface 710 is preferably substantially free of gaps, as such gaps may result in cracks or other points of weakness propagating through material spray-deposited above the interface 710. As shown in FIGS. 7C and 7D, after the tiles 110 are brought together and are substantially in contact, material 250 is spray-deposited within recess 700 to form joint 120. The material 250 is preferably sprayed to form a top surface substantially coplanar with the top surfaces of the tiles 110, such that the joined tile 100 has a substantially planar top surface. As also shown in FIGS. 7C and 7D, the tiles 110 (or effectively, the joined target 100) may be attached to a backing plate 130 either before or after the sprayed material 250 is deposited to complete the joint 120. After formation of the joint 120, the joined target 100 (at least proximate the joint 120) may be heat treated, for example as described above with reference to FIGS. 2A-2F.

Various embodiments of the present invention incorporate annealing steps to strengthen any or all of (i) the original material matrix of the tiles 110, (ii) the spray-deposited joint 120, and (iii) the bonding region between the original tile matrix and the sprayed layer (i.e., the tensile strength across the interface between the original tile and the sprayed layer). The table below shows the increase in tensile strength in all three regions for two different anneal conditions, a 16-hour anneal at 700° C. and a one-hour anneal at 900° C. In these joined targets, which are formed of MoTi, the original tile matrix was formed by HIP and the sprayed layer was formed by cold spray.

|  | Tile Matrix (psi) | Sprayed Layer (psi) | Bonding Region (psi) |
| --- | --- | --- | --- |
| No anneal | 64,958 | 28,600 | 1,297 |
| 700° C., 16 hours | 108,667 | 74,273 | 7,881 |
| 900° C., 1 hour | 94,793 | 57,364 | 6,445 |

Figure 8A:
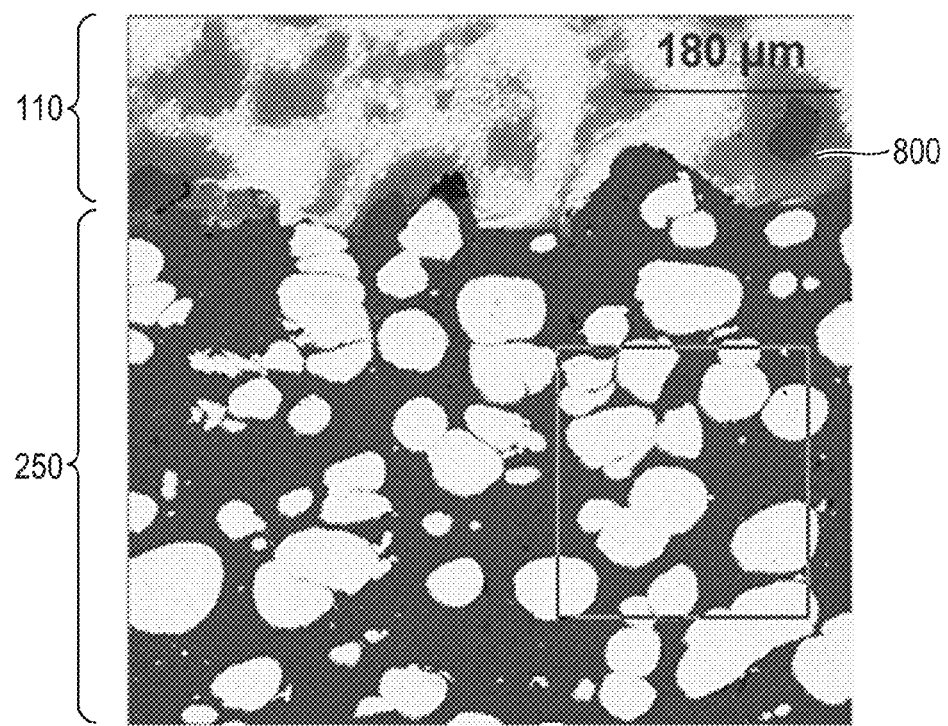
FIG. 8A is a cross-sectional micrograph of the microstructure of a joined sputtering target at the sputtering-target tile/sprayed material interface prior to annealing in accordance with various embodiments of the invention.
Figure 8B:
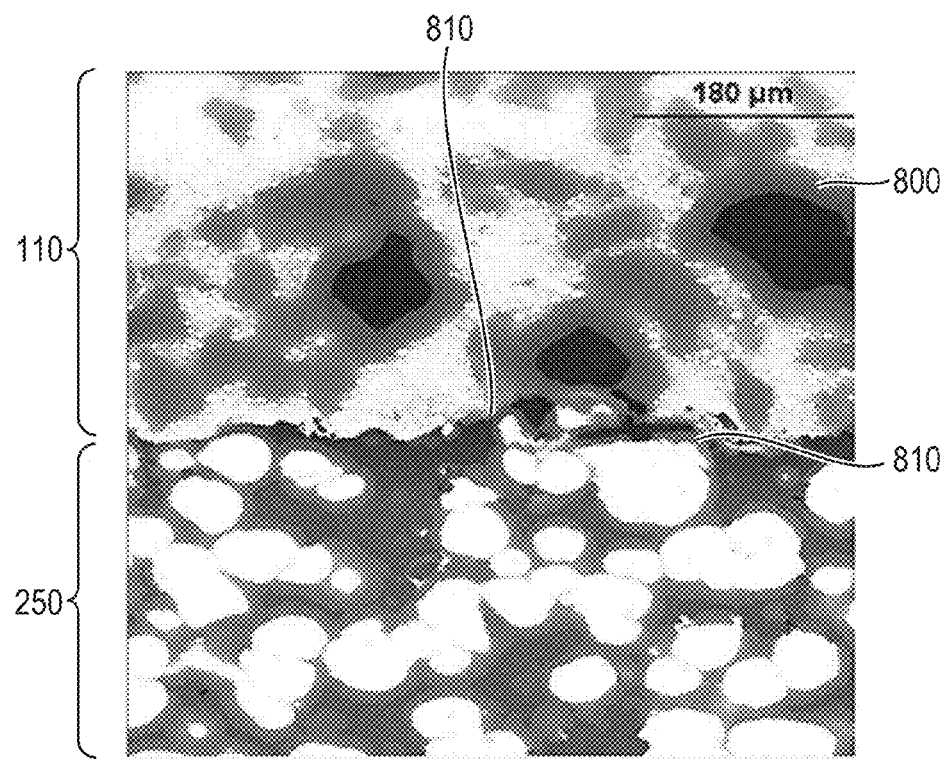
FIG. 8B is a cross-sectional micrograph of the microstructure of a joined sputtering target at the sputtering-target tile/sprayed material interface after annealing in accordance with various embodiments of the invention.

As shown in the table, both annealing conditions significantly increase the tensile strength of the joined target in all three regions. FIGS. 8A and 8B depict one contributor to the increased strength in the annealed targets. FIG. 8A is a cross-sectional micrograph of a spray joined MoTi tile in accordance with various embodiments of the invention before annealing, in which the original tile 110 matrix was formed by HIP and the sprayed layer 250 was formed by cold spray. As shown in FIG. 8A and as the above table indicates, the matrix of the original tile 110 has a higher initial tensile strength at least in part because the matrix includes not only discrete Mo and Ti phases (the light and dark areas), but also an interdiffused region 800 (indicated in gray) therebetween. In contrast, the sprayed layer 250 consists essentially of the pure Mo and Ti phases without any interdiffusion (likely due to the reduced temperature of the cold-spray process).

FIG. 8B is a cross-sectional micrograph of the same sample after annealing, where the original material matrix of the tile 110, the layer of spray-deposited material 250, and the bonding region between the original tile 110 matrix and the sprayed layer 250 all exhibit higher tensile strength (as shown in the above table). As shown in FIG. 8B, the annealing step has increased the size of the interdiffused area 800 in the original tile matrix and resulted in formation of interdiffused areas 810 in the spray-deposited layer 250. Furthermore, interdiffused material is evident at the bonding interface between the two regions, demonstrating that the anneal has resulted in diffusion bonding between the original tile 110 matrix and the sprayed layer 250, thus resulting in enhanced mechanical strength of the joined target 100. The interdiffused areas 800, 810 include or consist essentially of two or more (or even all) of the constituent materials of the tiles 110, while other areas of the tiles 100 and/or the sprayed material 250, at the microscale, include or consist only fewer (or even only one) of the constituents, as shown in FIGS. 8A and 8B. Various embodiments of the present invention incorporate a high-temperature annealing step after spray-deposition of the joining layer(s) 120 between the tiles 110. The annealing step is preferably of sufficient temperature and time to result in diffusion bonding between the tile(s) 110 and the material 250 of the sprayed joint 120. For example, the annealing step may be performed for a time between approximately ½ hour and approximately 20 hours and at a temperature between approximately 480° C. and approximately 1425° C., or at a temperature between approximately 1100° C. and approximately 1425° C. (i.e., higher than the melting point of conventional backing plates and soldering materials utilized to join sputtering targets to backing plates, e.g., In solder). In embodiments in which the tiles 110 are composites of multiple constituent materials, a thin layer of one or more (but not all) of the constituent materials (e.g., Ti for a Mo/Ti tile 110) may be spray-deposited prior to the spraying of the remaining material 250 (which may include or consist essentially of the material of the tiles 110, e.g., Mo/Ti). This thin layer may further improve bonding and interdiffusion across the joint 120. For example, for Mo/Ti tiles 110, a thin layer of Ti may substantially prevent Mo-to-Mo contact across the interface between the tile 110 and the sprayed material 250, where Mo self-contact may have little or no adhesive strength. The thickness of the thin layer may be, e.g., approximately 50 μm to approximately 100 μm, and/or the thickness may be approximately the same or slightly (e.g., 5-20%) larger than the average diameter of particles of one or more of the constituents in the layer. (For example, for a thin layer of Ti for a Mo/Ti tile 110, the thickness of the thin layer may be approximately the same or slightly larger than the average diameter of the Mo particles to substantially prevent self-contact thereof.)

Figure 9A:
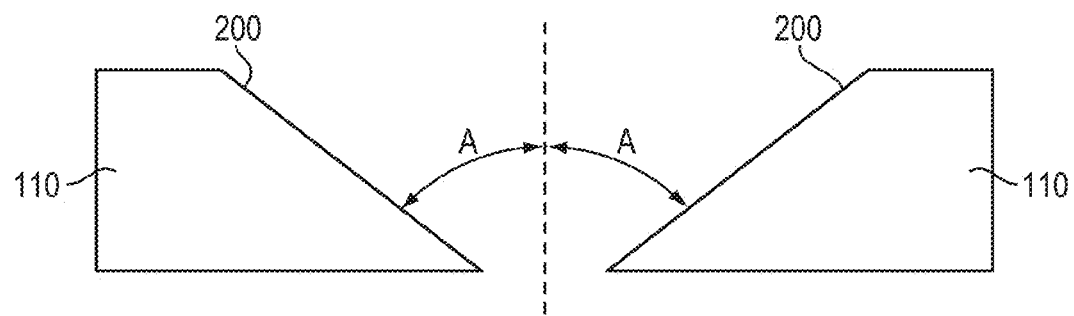
FIG. 9A is a schematic cross-section of two beveled sputtering-target tiles prior to being joined in accordance with various embodiments of the invention.
Figure 9B:
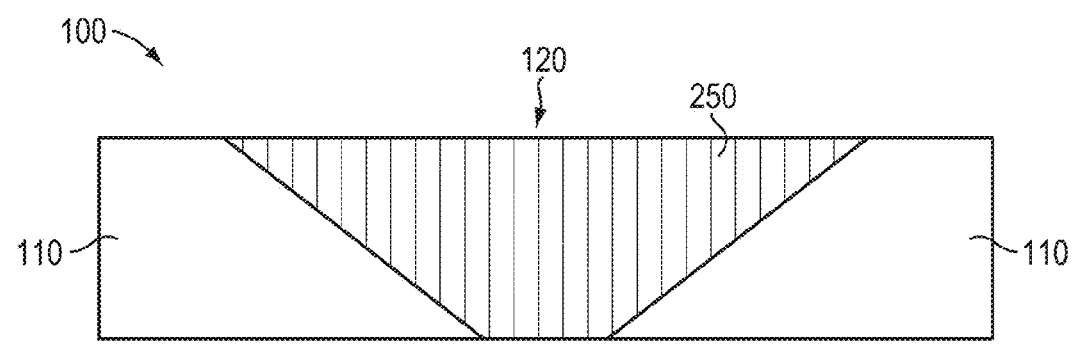
FIG. 9B is a schematic cross-section of two beveled sputtering-target tiles after being joined by spray deposition in accordance with various embodiments of the invention.
Figure 10A:
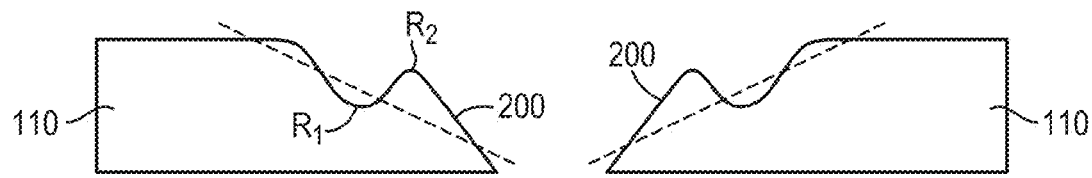
FIGS. 10A-10D are schematic cross-sections of sputtering-target tiles having different reentrant bevels in accordance with various embodiments of the invention.
Figure 10B:
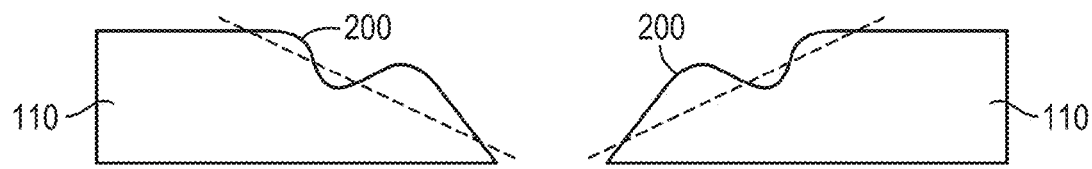
Figure 10C:
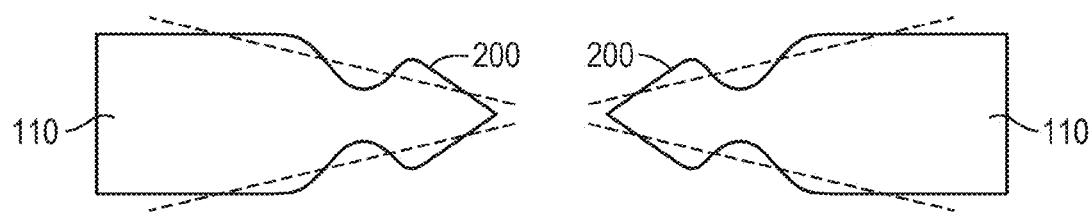
Figure 10D:
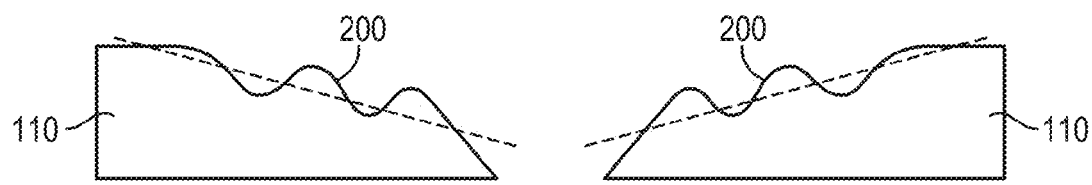

As mentioned above, the bevels 200 formed in tiles 110 to be joined may have any of a variety of shapes and make a variety of different angles with respect to the substantially planar top and/or bottom surfaces. (For tubular targets, the top and bottom surfaces are generally planar when viewed in cross-section, even though the surfaces themselves have curvature, as discussed above.) FIG. 9A depicts two tiles 110 to be joined in accordance with embodiments of the present invention each having a bevel 200 that is substantially planar and forms a bevel angle A with respect to the normal to the top and bottom surfaces. Tensile strength measurements were performed on three samples each having different angles A, where at each joint 120 each tile 110 had a bevel of angle A, and thus the entire included angle at the joint was 2A, as shown in FIG. 9B. The samples were tested utilizing the ASTM three-point bending test where loading was applied to the center of the joint 120. The table below presents the fracture stress for each sample, as well as the location of the crack formation at failure (in the matrix of the original tile 110, within the sprayed layer of material 250, and/or at the bonding interface therebetween).

| Bevel Angle A (degrees) | Anneal | Fracture Stress (psi) | Std. Dev. (psi) | Crack in Tile Matrix | Crack in Sprayed Layer | Crack in Interfacial Region |
| --- | --- | --- | --- | --- | --- | --- |
| 45 | None | 1900 | 1550 | | | X |
| 45 | 700° C. 16 hours | 11,250 | 15,700 | | | X |
| 45 | 900° C. 1 hour | 14,440 | 13,360 | | | X |
| 52.5 | None | 3580 | 1382 | | | X |
| 52.5 | 700° C. 16 hours | 4480 | 2743 | | | X |
| 52.5 | 900° C. 1 hour | 1710 | 1205 | | | X |
| 60 | None | 13,010 | 4670 | | X | |
| 60 | 700° C. 16 hours | 28,440 | 1920 | | X | X |
| 60 | 900° C. 1 hour | 32,860 | 4210 | | X | X |

As shown in the above table, generally the fracture strength of the joined target 100 increases with increasing bevel angle A. Moreover, failure was more likely to occur within the stronger sprayed joint 120 than only within the interfacial region as the bevel angle A increases. In these samples, the spray-deposited joint 120 was sprayed normal to the top surface of the target 100 (rather than to the surface of the bevel 200 itself); thus, fracture strength of the joint 120 increases as the spray direction approaches perpendicular to the surface of the bevel 200. Therefore, in various embodiments of the invention, at least a portion (and preferably an initial portion) of the spray-deposited layer joining the tiles is sprayed substantially perpendicular to the surface (or at least a portion thereof) of the bevel 200 formed in the tile 110. For example, a first portion of the sprayed layer 120 may be deposited in a direction substantially perpendicular to the surface of the bevel 200, and a second portion may substantially fill the remaining recess and be sprayed substantially perpendicular to the top surfaces of the tiles 110 being joined. The first portion may have a thickness of, e.g., between 1 µm and 10 µm, or even between 10 µm and 100 µm, or even thicker than 100 µm. In various embodiments of the invention, the first and second portions of the sprayed layer 120 may be distinguished via examination of the microstructure of the sprayed powder. For example, when powder is deposited via cold spray, the powder particles tend to flatten on impact (having slowed from supersonic velocity) with the substrate, and the particles are flattened along the spraying direction. (That is, an initially spherical particle will be flattened such that its surfaces approximately parallel to the spraying direction are closer together than its other surfaces.

In another embodiment, the bevel 200 formed in a tile 110 to be joined may even have a slight concavity and may thus be more parallel to the top and/or bottom surfaces of the tile 110 in the proximity of the joining edge of the tile 110. In such embodiments typical spray deposition angles approximately perpendicular to the tile 110 top surface will be more perpendicular to the surface of the bevel 200 in the center of the joint 120 (i.e., the region of the joint 120 that tends to have the least mechanical strength), thereby strengthening the joint 120.

Various embodiments of the present invention utilize bevels 200 having reentrant surfaces to facilitate formation of stronger spray-deposited joints 120. FIGS. 10A-10D depict exemplary reentrant bevels in accordance with embodiments of the present invention. As utilized herein a "reentrant surface" is one through which a straight line (illustrated in FIGS. 10A-10D as dashed lines) may be drawn such that it enters, exits and re-enters the surface at least once, or even twice or more. In general, the number of exit and re-entry points is one of the parameters that may be varied to optimize the reentrant surface of the bevel(s) 200 for strength of the joint 120. Reentrant surfaces may be composed of two or more generally straight segments and may feature one or more inflection points indicating changes in slope. Three-point fracture strength measurements were performed on two different samples each having the reentrant bevel surface illustrated in FIG. 10A, but employing different radii $R_1$, $R_2$ on the curved sections. Specimen 1 had a 4 mm radius $R_2$ of the concave-down surface and a 1 mm radius $R_1$ of the concave-up surface. In specimen 2, both radii were 2.5 mm. The samples were tested utilizing the ASTM three-point bending test where loading was applied to the center of a spray-deposited joint 120 between the tiles 110 (as shown, e.g., in FIG. 9B for tiles 110 without reentrant bevels 200). The table below presents the fracture stress for each sample, as well as the location of the crack at failure (in the matrix of the tile 100, within the sprayed layer 120, and/or at the bonding interface therebetween).

| Sample No. | Anneal | Fracture Stress (psi) | Std. Dev. (psi) | Crack in Tile Matrix | Crack in Sprayed Layer | Crack in Bonding Region |
| --- | --- | --- | --- | --- | --- | --- |
| 1 | None | 11,800 | 771 | | X | |
| 1 | 700° C. 16 hours | 38,910 | 3875 | X | X | |
| 1 | 900° C. 1 hour | 38,860 | 13,113 | | X | |
| 2 | None | 13,230 | 4547 | | X | |
| 2 | 700° C. 16 hours | 48,170 | 9545 | | X | |
| 2 | 900° C. 1 hour | 51,080 | 2006 | | X | |

As shown, the use of reentrant bevel surfaces not only results in generally stronger joints, but also shifts the failure location from the weaker interfacial bonding region to within the bulk of the sprayed layer 120 itself and sometimes even into the matrix of one of the tiles 110. Thus, the reentrant surface 200, at least in some embodiments, shifts the region of peak stress of the joined tile 100 away from the weakest part of the joint to a region of more mechanical strength.

Tiled sputtering targets 100 with spray-deposited joints 120, as described herein, do not only meet the larger size requirements of many sputtering applications, but also facilitate greater material utilization during sputtering. In magnetron sputtering with a set of individual tiles, the magnetron generally needs to provide a fixed electric field for each tile. Because of the shape of the field, the erosion pattern takes on the form of a race track in the plate, where the edges and the center of the tile are sputtered little if at all, resulting in the utilization of only about 30% of the target mass. On the other hand, a large tiled sputtering target, as provided by various embodiments of the present invention, facilitates use of a sweeping magnetron that causes a more uniform, larger erosion pattern (akin to the shape of an empty bath tub), as a result of which up to about 60% of the target may be sputtered.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A joined sputtering target comprising a sputtering material, the joined sputtering target comprising:
    first and second discrete sputtering-target tiles joined at an interface therebetween, the tiles comprising the sputtering material,
    wherein:
    the interface comprises a recess therealong at least partially filled with unmelted powder,
    the first tile comprises a beveled edge forming at least a portion of the recess and disposed in contact with the unmelted powder,
    the beveled edge has a reentrant surface comprising (i) one or more concave portions and (ii) one or more convex portions, and (iii) one or more inflection points each separating a concave portion from a convex portion, and
    no part of the beveled edge overlaps any portion of the second tile.

2. The joined sputtering target of claim 1, wherein the first and second tiles are joined at opposing edges, and the interface further comprises portions of the two opposing edges substantially in contact with each other and disposed beneath the at least partially filled recess.

3. The joined sputtering target of claim 1, wherein at least a portion of the beveled edge is substantially planar and forms an angle of greater than 45° with respect to a normal to a top surface of the joined sputtering target.

4. The joined sputtering target of claim 3, wherein the angle is selected from the range of 45° to 60°.

5. The joined sputtering target of claim 1, wherein the unmelted powder comprises the sputtering material.

6. The joined sputtering target of claim 5, wherein the unmelted powder consists essentially of the sputtering material.

7. The joined sputtering target of claim 1, wherein each of the first and second tiles consists essentially of the sputtering material.

8. The joined sputtering target of claim 1, wherein the sputtering material comprises a mixture or alloy of at least two constituent materials.

9. The joined sputtering target of claim 8, wherein the unmelted powder comprises discrete regions each substantially free of at least one of the constituent materials, and the joined sputtering target comprises at least one region at the interface in which at least two of the constituent materials are interdiffused.

10. The joined sputtering target of claim 8, wherein the at least two constituent materials comprise Mo and Ti.

11. The joined sputtering target of claim 1, further comprising a backing plate attached to the first and second tiles.

12. The joined sputtering target of claim 11, wherein the unmelted powder is in contact with the backing plate.

13. The joined sputtering target of claim 1, wherein at least a portion of the joined sputtering target is substantially planar.

14. The joined sputtering target of claim 1, wherein at least a portion of the joined sputtering target is substantially tubular.

15. The joined sputtering target of claim 1, wherein (i) the reentrant surface comprises a first concave portion having a first radius of curvature, (ii) the reentrant surface comprises a first convex portion having a second radius of curvature, and (iii) the first radius of curvature is approximately equal to the second radius of curvature.

16. The joined sputtering target of claim 1, wherein (i) the reentrant surface comprises a first concave portion having a first radius of curvature, (ii) the reentrant surface comprises a first convex portion having a second radius of curvature, and (iii) the first radius of curvature is smaller than the second radius of curvature.

17. The joined sputtering target of claim 1, wherein:
    each of the first and second tiles comprises a beveled edge forming at least a portion of the recess and disposed in contact with the unmelted powder,
    each beveled edge has a reentrant surface comprising (i) one or more concave portions and (ii) one or more convex portions, and (iii) one or more inflection points each separating a concave portion from a convex portion, and
    neither beveled edge overlaps any portion of the other tile.

18. The joined sputtering target of claim 1, wherein the reentrant surface comprises a plurality of concave portions, each pair of concave portions being separated by a convex portion therebetween.

19. The joined sputtering target of claim 18, wherein the reentrant surface comprises a plurality of convex portions.

20. The joined sputtering target of claim 1, wherein the interface comprises a gap between the first and second tiles having a width of at least 2 mm, the gap comprising unmelted powder therewithin.

21. The joined sputtering target of claim 20, wherein the width of the gap ranges from 2 mm to 8 mm.

22. The joined sputtering target of claim 1, wherein the sputtering material comprises at least one of titanium, niobium, tantalum, or tungsten.

23. The joined sputtering target of claim 1, wherein the sputtering material consists essentially of at least one of titanium, niobium, tantalum, or tungsten.

24. The joined sputtering target of claim 8, wherein the at least two constituent materials comprise W and Ti.

25. The joined sputtering target of claim 8, wherein the at least two constituent materials comprise Cu and W.

26. The joined sputtering target of claim 11, wherein the backing plate is attached to the first and second tiles via a joining compound.

27. The joined sputtering target of claim 26, wherein the joining compound comprises In solder.

28. The joined sputtering target of claim 1, wherein the joined sputtering target is substantially free of residual stress.

29. The joined sputtering target of claim 1, wherein an areal dimension of the joined sputtering target is at least 2800 mm×2500 mm.

30. The joined sputtering target of claim 1, wherein a length of the joined sputtering target is 2.7 meters or longer.

* * * * *